United States Patent

Bond et al.

[19]

[11] Patent Number: 6,112,159
[45] Date of Patent: Aug. 29, 2000

[54] ROBUST ELECTRICAL UTILITY METER

[75] Inventors: Randall K. Bond; Gordon G. Burns, both of West Lafayette; Robert E. Slaven, Lafayette; Christopher L. Anderson, Granger, all of Ind.

[73] Assignee: Siemens Power Transmission & Distribution, LLC, Wendell, N.C.

[21] Appl. No.: 08/881,140

[22] Filed: Jun. 24, 1997

Related U.S. Application Data

[63] Continuation-in-part of application No. 08/690,973, Aug. 1, 1996.

[51] Int. Cl.[7] .................................................. G01R 21/06
[52] U.S. Cl. ................... 702/61; 702/62; 702/64; 702/65; 702/82; 705/412; 324/74; 324/76.77; 324/86; 324/107; 324/140 R; 324/142; 304/657
[58] Field of Search .................. 702/61, 60, 64, 702/65, 62, 82, 58; 324/760.77, 76.52, 107, 108, 74, 86, 142, 116, 140 R, 141; 364/528.26, 528.21; 361/76, 77; 705/412; 340/657, 658, 660

[56] References Cited

U.S. PATENT DOCUMENTS

| | | | |
|---|---|---|---|
| 3,593,124 | 7/1971 | Cahen et al. | 324/52 |
| 4,559,491 | 12/1985 | Saha | 324/52 |
| 4,803,635 | 2/1989 | Andow | 364/483 |
| 4,901,005 | 2/1990 | Shin et al. | 324/86 |
| 5,469,049 | 11/1995 | Briese et al. | 324/76.77 |
| 5,471,137 | 11/1995 | Briese et al. | 342/158.1 |
| 5,537,029 | 7/1996 | Hemminger et al. | 324/142 |
| 5,537,333 | 7/1996 | Hemminger et al. | 702/60 |
| 5,544,089 | 8/1996 | Hemminger et al. | 364/492 |
| 5,621,629 | 4/1997 | Hemminger et al. | 363/56 |
| 5,631,554 | 5/1997 | Briese et al. | 324/76.77 |
| 5,631,843 | 5/1997 | Munday et al. | 364/528.21 |

FOREIGN PATENT DOCUMENTS

| | | |
|---|---|---|
| 0591942A1 | 4/1994 | Germany. |
| 1755208A1 | 8/1992 | Russian Federation. |

OTHER PUBLICATIONS

Article entitled "Detecting Transmission Line Abnormalites by Computer", by G.S. Hope and S.J. Jura, *Instrumentation Technology*, pp. 39–45, Feb. 1971.

*Primary Examiner*—James P. Trammell
*Assistant Examiner*—Tuan Q. Dam

[57] ABSTRACT

The present invention includes an electrical utility meter operable to measure power consumption. The method detects and compensates for one or more wiring errors that affects the power consumption measurement of the electrical utility meter. The method includes the steps of: obtaining measured phase angle data for a plurality of phases in a polyphase electrical system; periodically performing one or more diagnostic tests using the measured phase angle data to determine whether a wiring error is present, automatically adjusting the operation of the electrical utility meter to effect a compensation for the wiring error, said compensation increasing an accuracy of power consumption measurement of the electrical utility meter. The meter is operable to detect and compensate for wiring errors including polarity errors and cross phasing errors. According to another method of the present invention, the meter is operable to determine automatically the service type to which it is connected.

59 Claims, 11 Drawing Sheets

| METER FORM | SERVICE TYPE | ROTATION | Va | PHASE A | Vb | PHASE B | Vc | PHASE C |
|---|---|---|---|---|---|---|---|---|
| 9s | 4WY-120v | ABC | 120 | 0 | 120 | 120 | 120 | 240 |
| | 4WY-277v | ABC | 277 | 0 | 277 | 120 | 277 | 240 |
| | 4WY-120v | CBA | 120 | 0 | 120 | 240 | 120 | 120 |
| | 4WY-277v | CBA | 277 | 0 | 277 | 240 | 277 | 120 |
| | 4WY-120v | ABC | 60 | 0 | 60 | 180 | 104 | 90 |
| | 4WY-240v | ABC | 120 | 0 | 120 | 180 | 208 | 90 |
| | 4WY-480v | ABC | 240 | 0 | 240 | 180 | 416 | 90 |
| | 4WY-120v | CBA | 60 | 0 | 60 | 180 | 104 | 270 |
| | 4WY-240v | CBA | 120 | 0 | 120 | 180 | 208 | 270 |
| | 4WY-480v | CBA | 240 | 0 | 240 | 180 | 416 | 270 |

FIG. 10

ROBUST ELECTRICAL UTILITY METER

RELATED APPLICATION

This is a continuation in part of U.S. Ser. No. 08/690,973, filed Aug. 1, 1996 a co-pending patent application assigned to the assignee of the present invention.

FIELD OF THE INVENTION

The present invention relates generally to electrical utility meters, and in particular, electrical utility meters for use in polyphase power configurations.

BACKGROUND OF THE INVENTION

Electrical utility service providers, or simply utilities, monitor energy usage by customers through electrical utility meters. Electrical utility meters track the amount of energy consumed, typically measured in kilowatt-hours ("kwh"), at each customer's facility. Utilities use the consumption information primarily for billing, but also for resource allocation and other purposes.

Utilities generate polyphase electrical power, and typically three phase power. Polyphase electrical power is alternating current electrical power that is supplied on a plurality of power supply lines. The voltage waveform on each of the power supply lines has a unique phase angle. While only a single phase of the polyphase electrical power is typically provided for single family dwellings, true polyphase electrical power is generally provided to larger facilities such as commercial and industrial structures.

Historically, electrical utility meters utilized an inductive spinning disk to measure energy consumption. In such meters, the rate at which the spinning disk rotates varies proportionately to the amount of electrical power being consumed. The spinning disk drives mechanical counters, which, in turn, provide the accumulated energy usage information.

A recent development in electrical utility meters are electronic meters. Electronic meters replace the older inductive spinning disk meter design. Electronic meters have several advantages, including the advantage of providing features beyond straight-forward power consumption metering. Electronic meters, may, for example, track energy demand, power factor, and per phase power measurements. In addition, electronic meters may alter the method by which they calculate energy consumption in order to accommodate several building wiring and power configurations, thereby increasing the versatility of the meters.

Electronic meters are also capable of fairly sophisticated diagnostics. For example, U.S. Pat. No. 5,469,049 to Briese et al. teaches a diagnostic toolbox that is built into the meter. The diagnostic toolbox in the Briese et al. device measures per phase voltage and current magnitude and phase angles, and then compares the measured values with expected values to determine whether a wiring error is present. A wiring error is an error either in the meter itself or in the interface between the meter and the electrical system to which it is connected. Wiring errors typically cause a meter to make substantially inaccurate power measurements. As a result, wiring errors can cause loss of substantial revenue to utilities because the meter does not accurately record the actual energy amount that is consumed.

A drawback to the meter disclosed in the Briese et al. patent is that it displays identified errors, but requires servicing to correct the errors. Thus, while an error may be detected and displayed, the utility will continue to lose revenue until a service person can be dispatched to correct the error. Another drawback to the Briese et al. meter is that the meter must be preconfigured for the wiring configuration and voltage level, or service type, to which it is connected. The preconfiguration requirement is undesirable. For example, preconfiguring the meter during its manufacture introduces unwanted complexity into the inventory and delivery systems. Likewise, requiring that a technician provide such input to the meter during installation undesirably increases the complexity associated with installing the meters.

SUMMARY OF THE INVENTION

The present invention overcomes these and other drawbacks of the prior art by automatically identifying the service type to which the meter is connected to facilitate diagnostics and to adjust meter operation to compensate for any wiring errors detected during diagnostics.

The present invention includes an electrical utility meter operable to measure power consumption in a polyphase electrical system. The method detects and compensates for one or more wiring errors that affects the power consumption measurement of the electrical utility meter. The method includes the steps of: obtaining measured phase angle data for a plurality of phases in a polyphase electrical system; periodically performing one or more diagnostic tests using the measured phase angle data to determine whether a wiring error is present, and automatically adjusting the operation of the electrical utility meter to effect a compensation for the wiring error, said compensation increasing an accuracy of power consumption measurement of the electrical utility meter. The meter is operable to detect and compensate for wiring errors including polarity errors and cross phasing errors. According to another method of the present invention, the meter is operable to determine automatically the service type to which it is connected.

These as well as other features and advantages of the present invention will become more readily apparent to those of ordinary skill in the art by reference to the following detailed description and accompanying drawings.

BRIEF DESCRIPTION OF THE DRAWINGS

FIG. 10 shows a table of expected values corresponding to a plurality or service types.

DETAILED DESCRIPTION

Figure 1:
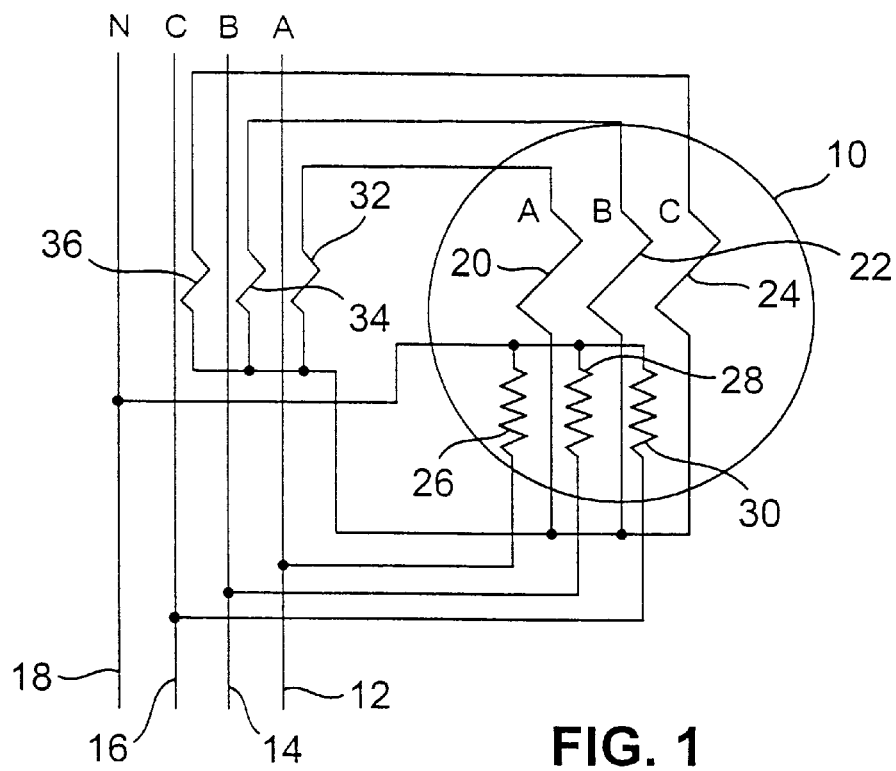
FIG. 1 shows an overview of an electrical utility meter wired for metering three phase electrical power service.

FIG. 1 shows an abstract overview of an electrical utility meter wired for metering three phase electrical power service. Shown is a meter 10, and a set of polyphase power lines including a phase A power line 12, a phase B power line 14, a phase C power line 16, and a neutral line 18. The meter 10 includes sensor circuitry comprising a phase A current sensor 20, a phase B current sensor 22, a phase C current sensor 24, a phase A voltage sensor 26, a phase B voltage sensor 28, and a phase C voltage sensor 30. The meter 10 includes a measurement circuit, not shown (see FIG. 4), that generates power consumption measurements and other information from the currents and voltages detected by the voltage sensors 26, 28 and 30 and the current sensors 20, 22, and 24.

The phase A current sensor 20 is connected to a first transformer 32, which is in turn advantageously situated to detect current on the phase A power line 12. The phase B current sensor 22 is likewise connected to a second transformer 34, which is in turn advantageously situated to detect current on the phase B power line 14. The phase C current sensor is connected to an analogously-situated third transformer 36. The phase A voltage sensor 26 is connected between the phase A power line 12 and the neutral line 18. The phase B voltage sensor 28 is connected between the phase B power line 14 and the neutral line 18. The phase C voltage sensor 30 is connected between the phase C power line 16 and the neutral line 18.

The phase A power line 12, phase B power line 14, and phase C power line are part of a 120 volt four wire wye service type, which is well known in the art. Polyphase electrical power is provided to customers in a plurality of configurations, known as service types. A service type is typically defined by the nominal voltage level and a wiring configuration. A wiring configuration is further defined by the number of wires (three wire or four wire) and the wiring relationship between the phases (wye or delta). For example, a 120 volt four wire wye service type has a nominal voltage level of 120 volts and a four wire wye wiring configuration. The most commonly-used service types are standardized and are well-known to those of ordinary skill in the art.

Different standard watt-hour meter types, known as meterforms, are used to measure the power consumption for the various service types. The exemplary meter 10 of FIG. 1 has a 9S meter form. As is well-known in the art, the meter form that is appropriate for use in a particular customer facility depends on a number of factors, including: the service type, the maximum level of current expected; the accuracy needed; cost; and whether the wiring configuration has a common neutral. The commonly-used meter forms include those designated as 5S, 45S, 6S, 36S, 9S, 16S, 12S and 25S meter forms, and each are capable of metering a plurality of service types. The use of a 9S meter form for the meter 10 is given by way of example only and the implementation of the present invention is in no way limited to a particular meter form.

Figure 1A:
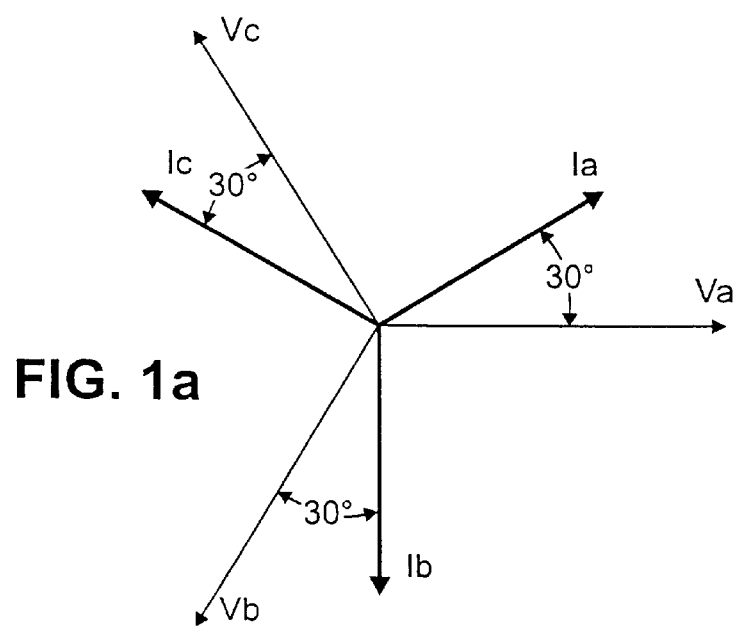
FIG. 1a shows a phasor diagram that illustrates the relationship between the three voltage and current phases in the meter wired as shown in FIG. 1.

FIG. 1a shows a phasor diagram that illustrates the relationship between the three voltage and current phases detected by the sensor circuitry of the meter 10, as it is wired in FIG. 1. Generally, in a four wire wye wiring configuration, the three voltage phases will typically be separated by a phase angle of approximately 120°, as will the three current phases. Each phase current and its corresponding phase voltage are typically separated by a 0° to 90° phase angle, such as 30° as shown in FIG. 1a. The phase angle varies depending on the type of load that is attached to the electrical system being metered.

Figure 2:
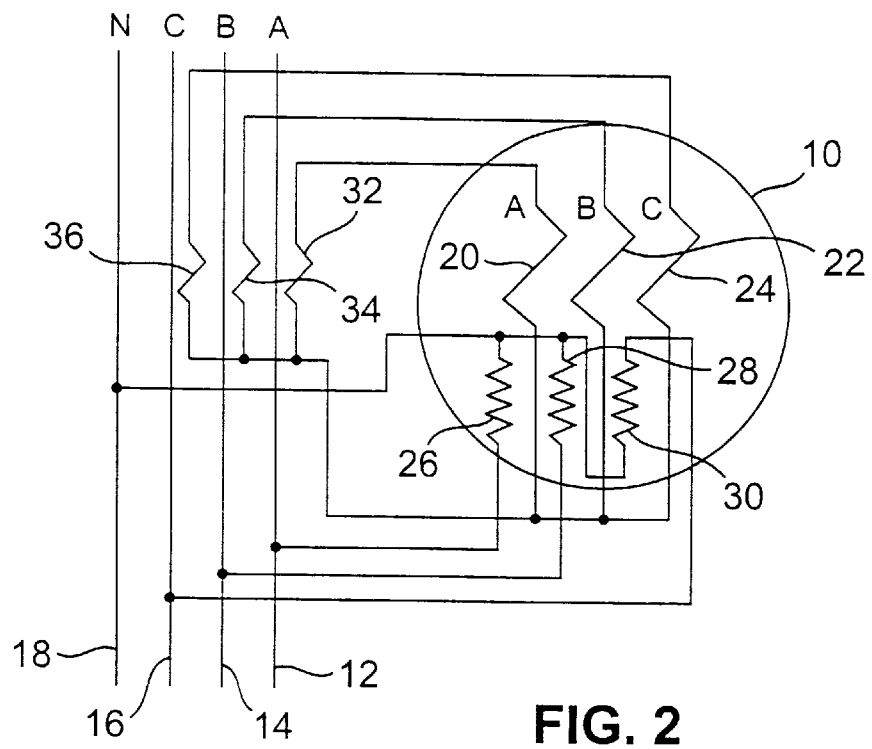
FIG. 2 shows an overview of an electrical utility meter wired for metering three phase electrical power in a manner that includes a voltage polarity error in which one voltage phase is 180° out of phase.
Figure 3:
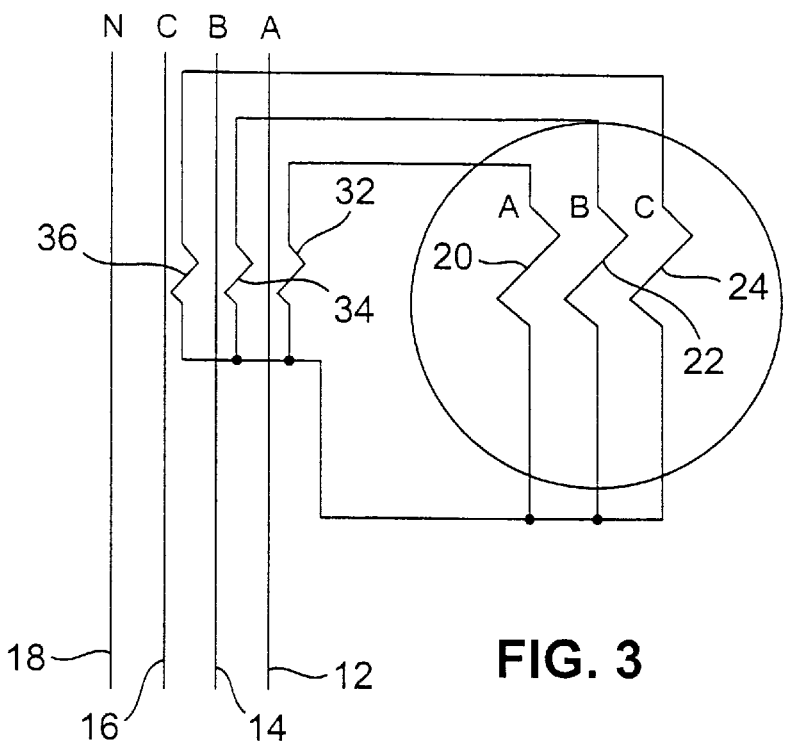
FIG. 3 shows an overview of an electrical utility meter wired for metering three phase electrical power in a manner that includes a cross phasing error in which two current phases are cross-wired.

For the purposes of clarifying some of the advantages of the present invention, FIGS. 2 and 3 illustrate two situations in which a wiring error can cause a revenue loss to a utility.

Figure 2A:
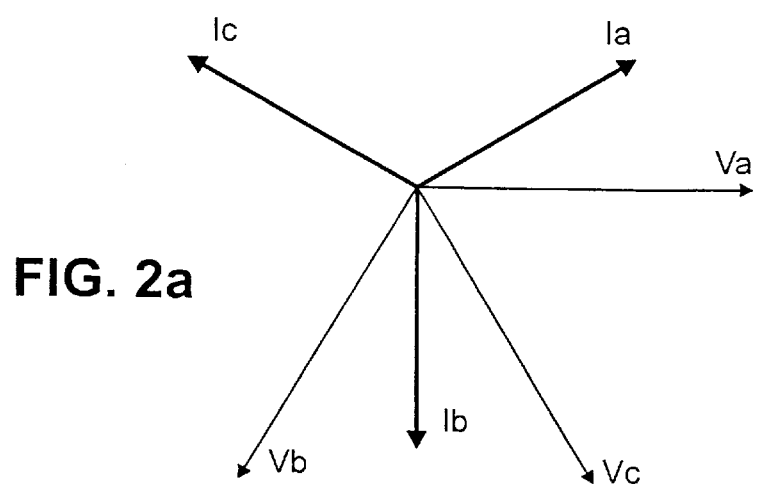
FIG. 2a shows a phasor diagram that illustrates the relationship between the three voltage phases and current phases as measured by the meter wired as shown in FIG. 2.

FIG. 2 shows an overview of the electrical utility meter wired in a manner that includes a wiring error known as a voltage polarity error. A voltage polarity error is an error in which the measurements from one voltage phase are 180° out of phase. For purposes of clarity, the components of FIG. 2 will have the same reference characters as like components in FIG. 1. As shown in FIG. 2, the connection between the phase C power line 16 and the phase C voltage sensor 30 has been juxtaposed with the connection between the neutral line 18 and the phase C voltage sensor 30. The result of this juxtaposition is that the phase C voltage detected by the sensor circuitry of the meter 10 will be detected as 180° out of phase, as shown in FIG. 2a. Because the phase C voltage is 180° out of phase, the phase C power measurements, $V_C * I_C$, will produce negative values. The introduction of a negative power consumption measurement greatly reduces the overall power consumption measurement, resulting in loss of revenue for the utility. According to the present invention as discussed in further detail below in connection with FIGS. 4 and 7, the measurement circuitry of the meter 10 identifies, and consequently compensates for, the voltage polarity error illustrated in FIGS. 2 and 2a. As a result, the compensated power consumption measurement does not have a negative component and is therefore more accurate.

Figure 3A:
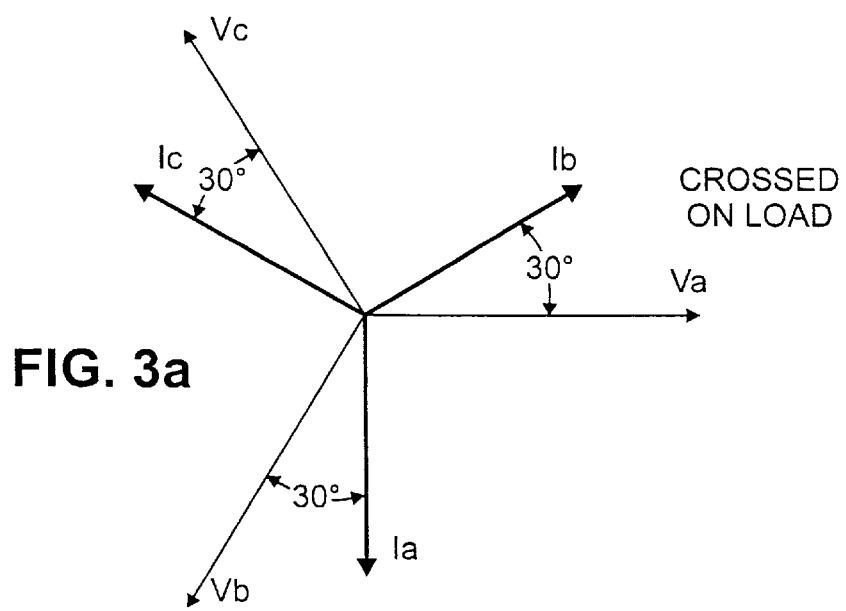
FIG. 3a shows a phasor diagram that illustrates the relationship between the three voltage phases and current phases as measured by the meter wired as shown in FIG. 3.

FIG. 3 shows an overview of an electrical utility meter wired in a manner that includes a wiring error known as a cross phasing error. A cross phasing error is an error in which the measurements from two current phases are interchanged, often due to cross-wiring. For purposes of clarity, the components of FIG. 3 will have the same reference characters as like components in FIG. 1. As shown in FIG. 3, the connection between the first transformer 32 and the phase A current sensor 20 has been juxtaposed with the connection between the second transformer 34 and the phase B current sensor 22. The result of this juxtaposition is that detection circuit will process the phase A current as the phase B current, and vice versa. FIG. 3a shows a phasor diagram that illustrates the relationship between the three voltage phases and current phases as measured by the detection circuit with the cross wiring error illustrated in FIG. 3. Cross phasing also results in substantially inaccurate power measurements that cause revenue loss to the utility. According to the present invention as discussed in further detail below in connection with FIGS. 4 and 8, the measurement circuitry of the meter 10 identifies, and consequently compensates for, the cross phasing error illustrated in FIGS. 3 and 3a.

Figure 4:
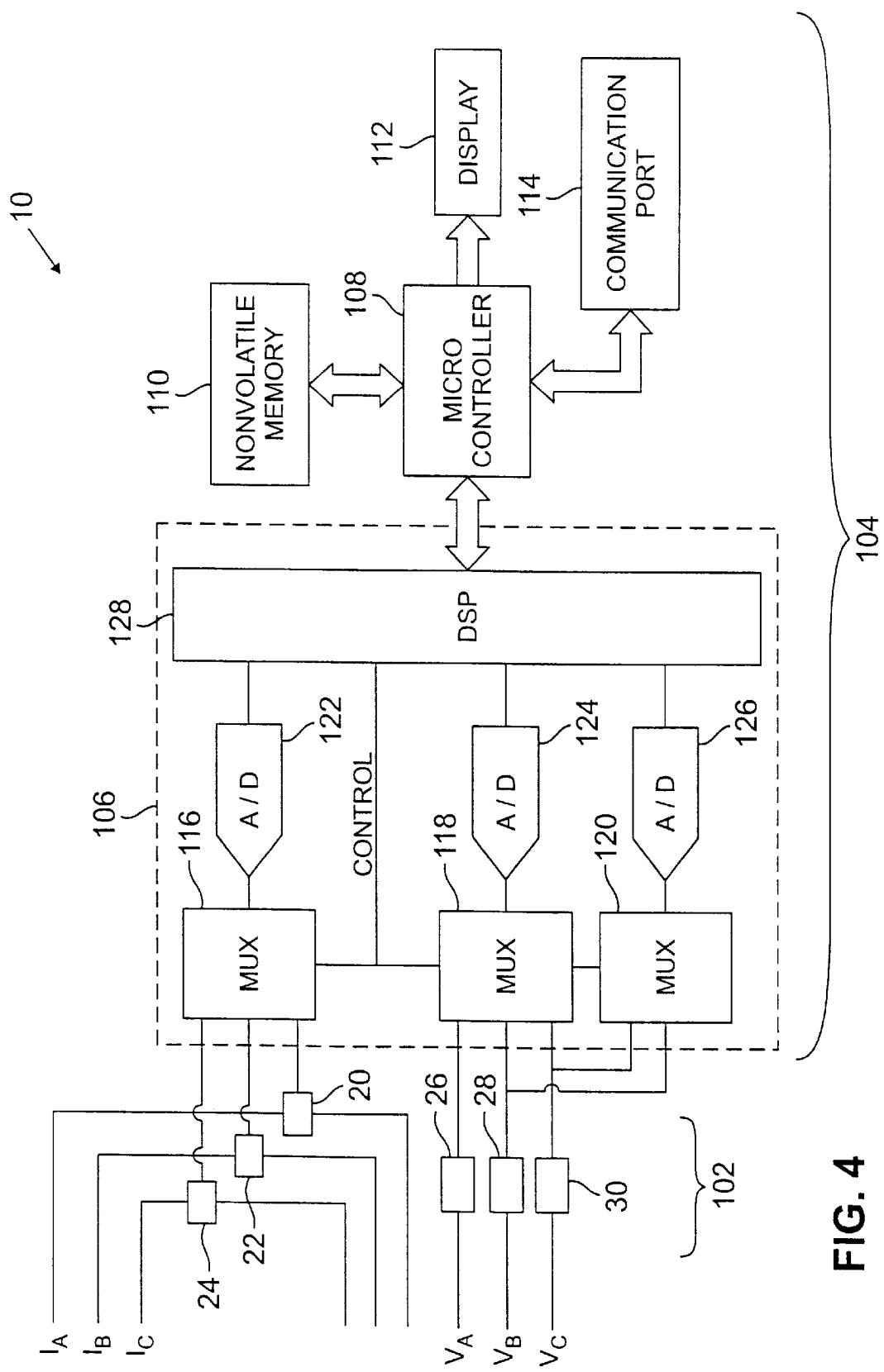
FIG. 4 shows a block diagram of an electrical utility meter according to the present invention.

FIG. 4 shows a block diagram of an electrical utility meter according to the present invention. The meter 10 essentially comprises sensor circuitry 102 and a measurement circuit 104. The sensor circuitry 102 includes the phase A current sensor 20, the phase B current sensor 22, and the phase C current sensor 24 as shown in FIGS. 1, 2 and 3, referred to collectively as a polyphase current sensor. The sensor circuitry 102 further includes the phase A voltage sensor 26, the phase B voltage sensor 28, and the phase C voltage sensor 30 as shown in FIGS. 1, 2 and 3, referred to collectively as a polyphase voltage sensor. The measurement circuit 104 further comprises a conversion circuit 106, a processor 108, a nonvolatile memory 110, a display 112, and a communication port 114.

The phase A current sensor 20 is connected to receive a signal indicative of the current flowing through the phase A power line 12 (see FIG. 1). To this end, as shown in FIG. 1, the phase A current sensor 20 is connected to the first transformer 32, which is advantageously situated to detect current on the phase A power line 12 and produce a signal indicative of the quantity of current thereon. The phase A current sensor is further connected to the measurement circuit 104 through the first multiplexer 116. The phase A current sensor 20 may comprise a current transformer or any other device known in the art that detects current from the first transformer 32 and produces a signal indicative of the quantity of detected current. In alternative embodiments, the current sensor 20 measures directly the current flowing through the phase A power line 12 and, as a result, the first transformer 32 is not needed. Direct measurement of current is performed in self-contained meter forms, which are well known. An embedded coil sensor may suitably be used as a current sensor in self-contained meter forms.

The phase B current sensor 22 is connected to receive a signal indicative of the current flowing through the phase B power line 14 (see FIG. 1), in a manner analogous to that discussed above in connection with phase A. The phase B current sensor 22 is further connected to the measurement circuit 104 through the first multiplexer 116. Likewise, the phase C current sensor 24 is connected to receive a signal indicative of the current flowing through the phase C power line 16 (see FIG. 1). The phase C current sensor 24 is also connected to the measurement circuit 104 through the first multiplexer 116. The phase B current sensor 22 and the phase C current sensor 24 preferably have the same structure as the phase A current sensor 20.

The phase A voltage sensor 26 is connected directly to the phase A power line 12 (see FIG. 1) to obtain a voltage measurement therefrom. To this end, the phase A voltage sensor 26 may suitably comprise a high resistance voltage divider. The phase A voltage sensor 26 is further connected to the measurement circuit 104 through the second multiplexer 118. The phase B voltage sensor 28 is likewise connected to obtain a voltage measurement from the phase B power line 14, and is further connected to provide the voltage measurement to the second multiplexer 118. The phase C voltage sensor 30 has a similar structure and is connected to the phase C power line 16 and the multiplexer 118 in an analogous manner as the phase A voltage sensor 26 and the phase B voltage sensor 28.

The conversion circuit 106 is a circuit operable to receive polyphase voltage and polyphase current measurement signals and generate digital data therefrom. The generated digital data includes power consumption data and measured voltage and current amplitude and phase angle data. In the exemplary embodiment described herein, the conversion circuit comprises first, second and third multiplexers, 116, 118, and 120, respectively, first, second, and third analog to digital converters ("A/Ds") 122, 124 and 126, respectively, and a digital signal processor 128. The above listed components of the conversion circuit 106 may suitably be incorporated onto a single semiconductor substrate. An example of a suitable conversion circuit is the Power Measurement Integrated Circuit found in a model S4 electrical utility meters available from Landis & Gyr Utility Services, Inc.

The controller 108 is operably configured to, and executes programming instructions to, receive the digital data from the conversion circuit 106, monitor and record power consumption using the digital data, and determine whether one or more wiring errors are present using the digital data. The controller 108 may suitably be a K0 series microcontroller available from NEC. The controller 108 generally includes firmware, or in other words, an integrated memory into which programming instructions are stored. Alternatively, the programming instructions may be stored in the nonvolatile memory 110.

The third multiplexer 120 and third A/D 126 provide additional capabilities to the meter 10 that are outside the scope of the present invention.

In operation, the phase A, B and C current sensors 20, 22, and 24, respectively, detect the phase A current, the phase B current, and the phase C current. The phase A current sensor 20 provides a phase A current measurement signal to the first multiplexer 116, the phase B current sensor 22 provides a phase B current measurement signal to the first multiplexer 116, and the phase C current sensor 24 provides a phase C current measurement signal to the first multiplexer 116. Each current measurement signal typically comprises a signal having a voltage level that is representative of the instantaneous current level on its respective phase. For current transformers designed for utility meter use, the current measurement signals are relatively low in amplitude. For example, in embodiments that utilize the Power Measurement Integrated Circuit from Landis & Gyr Utility Services, the current measurement signals measure from 0.0 Vrms to 0.3 Vrms maximum. Other scaling factors may of course be employed in other embodiments.

The first multiplexer 116, under the control of the controller 108, provides the instantaneous current measurement signal from one of the phase A, phase B, or phase C current measurement signals to the first A/D converter 122. The first multiplexer 116 typically provides each phase in a rapid succession of cycles, such that each phase is provided to the first A/D converter 122 every third cycle. According to the exemplary embodiment described herein, the first multiplexer 116 provides the current measurement signals at a cycle rate of 3.3 kHz.

The first A/D converter 122 receives and samples or digitizes the rapid succession of instantaneous current measurement signals. The first A/D converter 122 then provides to the DSP 128 a stream of digital current measurement samples, each representing the magnitude of one of the three phase currents at a particular instant. The stream of digital words provided by the first A/D converter 122 is referred to herein as the digital current measurement signal.

Contemporaneously, the phase A, B and C voltage sensors 26, 28, and 30, respectively, detect the phase A voltage, the phase B voltage, and the phase C voltage. The phase A voltage sensor 26 provides a phase A voltage measurement signal to the second multiplexer 118, the phase B voltage sensor 28 provides a phase B voltage measurement signal to the second multiplexer 118, and the phase C voltage sensor 30 provides a phase C current measurement signal to the second multiplexer 116. Each voltage measurement signal is typically a signal having a voltage level that is representative of the instantaneous voltage level on its respective phase. In the exemplary embodiment described herein, that uses the Power Measurement Integrated Circuit, the voltage sensors are configured to provide voltage measurement signals that range from 0.0 Vrms to 0.3 Vrms maximum. Other scaling factors may of course be employed in other embodiments.

The second multiplexer 118 then provides, one at a time, the instantaneous phase A, phase B, or phase C voltage measurement signals to the second A/D converter 124. To this end, the second multiplexer 118 is controlled by the controller 108. The second multiplexer 118 typically provides each phase voltage measurement signal in a rapid succession of cycles, such that each phase is provided to the second A/D converter 124 every third cycle. In any event, the second A/D converter 124 receives and samples or digitizes the rapid succession of instantaneous voltage measurement signals. The second A/D converter 124 then provides a stream of digital voltage measurement samples, or simply a digital voltage measurement signal, to the DSP 128.

The first A/D converter 122 and the second A/D converter 124 provide the digital voltage and current measurement signals in a predetermined coordinated phase relationship. According to the exemplary embodiment described herein, the second multiplexer 118 provides the voltage measurement signals at the same rate as that used by the first multiplexer 116 to provide the current measurement signals to the first A/D converter 122. Moreover, the first multiplexer 116 and the second multiplexer 118 operate in a coordinated fashion to provide certain phase current measurement signals at the same time as certain phase voltage measurement signals. For example, in a four wire wye meter configuration, the first multiplexer 116 provides the phase x current measurement signal and the second multiplexer 118 provides the phase x voltage measurement signal contemporaneously, where x rotates among A, B and C.

The DSP 128 within the conversion circuit 106 receives the digital current measurement signal and digital voltage measurement signal determines power consumption therefrom. To this end, the DSP 128 selectively multiplies the voltage measurement samples and the current measurement samples, received from the A/D converters 122 and 124, and then adding them together. For example, in a four wire wye configuration, the appropriate power calculation is:

$$\text{POWER} = V_A I_A + V_B I_B + V_C I_C, \tag{1}$$

Where POWER is given in watts.

The DSP 128 carries out the above calculation in the manner described herebelow. As discussed above, the A/D converters 122 and 124 provide the current and voltage measurement samples for each phase contemporaneously. The DSP 128 multiplies each voltage measurement sample with the contemporaneously received current measurement sample. The resulting product is added to a running total or sum. In other words, if $\text{DIG\_V}_x$ is a sample from a digital voltage measurement signal for a phase x and $\text{DIG\_I}_x$ is a sample from a digital current measurement signal for the phase x, then the DSP 128 carries out the following calculation:

$$\text{POWER} = \text{SUM}(\text{CAL\_V}_x \text{DIG\_V}_x * \text{CAL\_I}_x \text{DIG\_I}_x) \text{ for } x = \{A, B, C, A, B, \ldots\}, \tag{2}$$

where $\text{CAL\_V}_x$ and $\text{CAL\_I}_x$ are per phase calibration constants. The per phase calibration constants are determined empirically during manufacture and account for variance in the voltage and current sensor device performance.

The DSP 128 provides power measurement data to the controller 108 at regular time intervals, the power measurement data consisting of the POWER sum for each time interval. The controller 108 then accumulates the power measurement data until a predefined watt-hour unit threshold has been reached. Once a predefined watt-hour unit threshold has been reached, the controller 108 generates a power consumption pulse and then increments a power consumption counter. The controller 108 then repeats the process, or in other words, begins accumulating power measurement data until the predetermined watt-hour threshold is again reached.

The power consumption counter is the means by which customer energy consumption is tracked. For example, as is well known, a utility may determine a particular customer's consumption for a particular billing cycle by subtracting the power consumption counter value at the beginning of the billing cycle from the power consumption counter value at the end of the billing cycle. The controller 108 preferably provides the power consumption counter information to both the nonvolatile memory 110 and the display 112. The display 112 then provides a visual representation of the power consumption counter information from which readings may be taken by utility personnel. The nonvolatile memory 110 stores the power consumption counter information for the purposes of retention in the case of a power interruption.

Optionally, the controller 108 further provides the power consumption counter information, as well as other information, to the communication port 114. The communication port 114 may then communicate the information over an external communication means, such as a public telephone network, to a central processing facility for the utility. In this manner, the utility may track and bill for power consumption registered by the meter 10 without requiring an employee to physically view the meter.

The controller 108 additionally has the capability of providing alternative power information, such as VA, VAR and power factor. The VA quantity is a well known power consumption quantity that is, in some circumstances, more accurate than measured watts in quantifying the electric power actually consumed by a customer. The controller 108 is operable to determine such alternative power information, including VA, using methods well known in the art.

The controller 108 also generally controls the operation of the measurement circuit 104, and particularly, the first, second, and third multiplexers 116, 118 and 120, respectively, the first, second, and third A/D converters 122, 124 and 126, respectively, and the digital signal processor 128. To this end, the processor provides timing signals and other control signals to the various elements of the conversion circuit 106 as necessary to carry out the operations described above. In controlling the operation of the measurement circuit 104, the controller 108 may effectuate a compensation if a wiring error is detected. The operation of the controller 108 to effect a compensation is discussed in further detail below in connection with FIGS. 7, 8, and 9.

In addition to generating power consumption data, the DSP 128 also determines and provides other information to the controller 108. In particular, the DSP 128 provides for each phase, the measured voltage and current magnitude data, and the measured voltage and current phase angle data. The measured voltage and current magnitude data typically represent the per phase RMS values. The measured voltage and current phase angle data typically represent the phase angle of each phase voltage and current with respect to a base phasor, for example $V_A$.

To determine the measured voltage and current magnitude data, the DSP 128 performs an RMS calculation on each digital voltage and current measurement signal. This calculation may, for example, include the following steps: multiplying each of the digital current measurement signal samples by each of the digital voltage measurement signal samples for each phase to produce squared samples; taking the mean of the squared samples over time; and then taking the square root of the resulting mean.

To determine phase angle data for each phase voltage, the DSP 128 determines the time differences between the zero crossings of the voltage signals. The time difference between the zero crossing of a particular signal and the signal that is used as the base phasor, and the direction of the respective zero crossings, provides the phase information. In the exemplary embodiment described herein, $V_A$ is used as the base phasor. Accordingly, the phase angle of $V_B$ is measured by obtaining the difference in time of the zero crossings between $V_A$ and $V_B$, as well as the direction of the crossing.

To determine phase angle data for each phase current, the DSP 128 first determines the watts$_x$ and the VAR$_x$ for each phase x. Watts per phase is calculated using the power calculation based on the product of DIG_$V_x$ and DIG_$I_x$ for each phase x. VAR per phase is calculated based on the product of DIG_$V_x$ and DIG_$V_x(-90°)$ for each phase x. In the exemplary embodiment herein, the DSP 128 provides the VAR$_x$ and Watt$_x$ data, which contains the current phase angle information, to the controller 108. The controller 108, as described below, actually calculates the measured phase angle values from this data.

Once the controller receives the measured voltage and current magnitude and phase angle data from the DSP 128, the controller 108 then determines measured voltage and current magnitude and phase angle values. Table 1, below shows each measured value determined by the controller 108.

TABLE 1

| |
|---|
| VRMS$_A$ = Phase A voltage magnitude |
| VRMS$_B$ = Phase B voltage magnitude |
| VRMS$_C$ = Phase C voltage magnitude |
| IRMS$_A$ = Phase A current magnitude |
| IRMS$_B$ = Phase B current magnitude |
| IRMS$_C$ = Phase C current magnitude |
| V<$_A$ = Phase A voltage phase angle |
| V<$_B$ = Phase B voltage phase angle |
| V<$_C$ = Phase C voltage phase angle |
| I<$_A$ = Phase A current phase angle |
| I<$_B$ = Phase B current phase angle |
| I<$_C$ = Phase C current phase angle |

It is noted that the processor need not perform further calculations to the measured voltage and current magnitude data to obtain the corresponding measured values, as the DSP 128 has already provided the data in RMS magnitude format. However, in the present embodiment, the controller 108 must perform further calculations to determine the measured voltage and current phase angle values from the measured voltage and current phase angle data. In particular, the measured voltage phase angle voltage data consists of a series of zero crossing data which are converted to phase angle values. Those of ordinary skill in the art could readily program the controller 108 to perform such a conversion. The measured current phase angle data consists of VAR$_x$ and Watts$_x$ which the controller 108 converts to phase angle values using the equation I<$_x$=arctan (VAR$_x$/Watts$_x$). Alternatively, it is contemplated that the DSP 128 could be configured to provide the measured voltage and current phase angle data in the measured value format shown in Table 1.

As will become more readily apparent below, the controller 108 employs the measured values from Table 1 in diagnosing and compensating for measurement errors. It is furthermore noted that in service types that include a neutral line, the RMS current of the neutral line, IRMS$_N$, may be determined by adding the other currents together. Thus, in a four wire wye wiring configuration, IRMS$_N$=IRMS$_A$+IRMS$_B$+IRMS$_C$.

Figure 5:
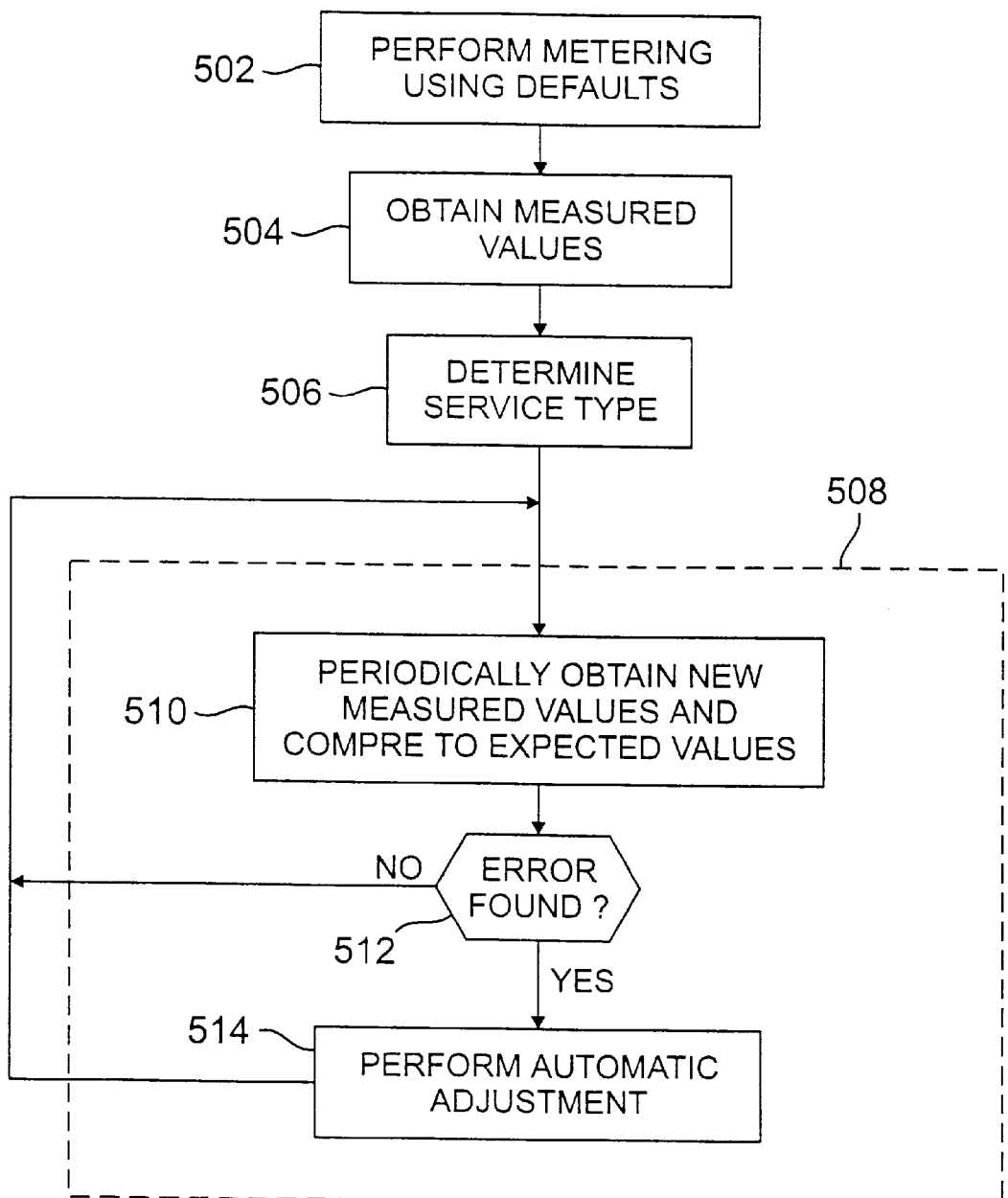
FIG. 5 shows a flow diagram of the operations general operations of the controller of an electrical utility meter according to the present invention.

FIG. 5 shows a flow diagram of the general operations of the processor of an electrical utility meter according to the present invention. In particular, the controller 108 first initializes the measurement circuit 104 to operate using a default configuration (step 502). The default configuration consists of, among other things, the multiplexing scheme of the multiplexers 116, 118 and 120, the POWER calculations, VAR calculations, and measured voltage and current magnitude and phase calculations, and other calculations performed by the DSP 128, the controller 108, or some combination of both the DSP 128 and controller 108. In the present embodiment, the controller initializes the measurement circuit 104 to operate as described above in connection with FIG. 4.

The controller 108 next obtains measured values from the conversion circuit 106 (step 504). The measured values may include measured voltage magnitude, voltage phase angle, current magnitude, or current phase angle values, or any combination thereof.

The controller 108 uses the measured values to determine the service type to which the meter is connected, or present service type (step 506). The controller 108 determines the present service type automatically, as discussed further below in connection with FIG. 6. A suitable service type recognition feature that may readily be incorporated into the present embodiment is described in the parent U.S. patent application Ser. No. 08/690,973, incorporated herein by reference. Once the service type is recognized, the meter may self-configure to perform measurements for the recognized service type and then continue metering as described above in connection with FIG. 4. For example, because different calculations are necessary to meter three wire delta wiring configurations and four wire wye wiring configurations, the meter needs to self-configure to perform measurements appropriate for recognized service type.

In an alternative embodiment, the meter may be limited to a particular service type, or be manually configured for a particular service type. In some systems, the service type is predetermined for a meter by setting jumpers or configuring a DIP switch. In such an alternative meter, the steps 504 and 506 are unnecessary. However, automatic service type recognition greatly enhances the versatility of the meter, because it does not require special programming installation personnel or preconfiguring at the factory.

In any event, the controller 108 thereafter periodically performs diagnostics to determine if a wiring error is present, and effect a compensation if a wiring error is detected (block 508). In particular, the controller 108 first obtains new measured values from the conversion circuit and compares the values with the set of expected values corresponding to the present service type (step 510). The measured values may include the same values discussed above in connection with step 504, or may include more or less values, depending on the diagnostic capabilities of the meter. In the present embodiment, the measured values used for diagnostics include all of the voltage and current magnitude and phase values.

The controller 108 then determines whether an error is present (step 512). To this end, the controller 108 determines whether each of the measured values are within an acceptable tolerance or range for the corresponding expected value. If no error is detected, then the controller 108 continues to perform metering functions and awaits the next periodic diagnostics check (step 508). If an error is detected, however, then the controller 108 performs an automatic adjustment as described further below (step 514).

Consider, for example, a meter installed in a 120 volt, four wire wye service type, such as is illustrated in FIG. 1. The expected values (with tolerances) are: $VRMS_A=VRMS_B=VRMS_C=120$ vrms (96 vrms through 138 vrms); $V<_A=0°$ (reference); $V<_B=120°\pm10°$; $V<_C=240°\pm10°$; $I<_A=0°\pm90°$; $I<_B=120°\pm90°$; and $I<_C=240°\pm90°$. It is noted that there are generally no expected current magnitude values because current consumption varies from customer to customer. Nevertheless, a provision may be made for the customer to define expected current magnitude values for a particular application. In any event, if the measured values for $VRMS_A$, $VRMS_B$, $VRMS_C$, $V<_A$, $V<_B$, $V<_C$, $I<_A$, $I<_B$, and $I<_C$ are all within the expected ranges, then no error is detected. If, however, one or more values are not within the expected ranges, then a wiring error is indicated. For example, if the value $V<_C$ is not between 230° and 250°, but rather has a value of 60°, then the controller 108 detects an error. Under those circumstances, the controller 108 may determine that the phase C voltage connection is 180° out of phase. Such a reading indicates the existence of a voltage polarity error on the phase C voltage measurement sensor, such as illustrated in FIGS. 2 and 2*a*.

Returning to the general description of FIG. 4, if an error is present, then the controller 108 performs an adjustment (step 514) to the measurement circuit 104, and typically the conversion circuit 106 (see FIG. 4). The adjustment effects a compensation that corresponds to the detected error, and serves to increases the accuracy of the meter. In the above described example in which the polarity is reversed on $V_C$, the controller 108 would effect a compensation by providing control signals to one or more elements of the measurement circuit 104 to compensate for the polarity reversal. For example, the controller 108 may provide a signal to the DSP 128 that causes the DSP 128 to scale all $DIG\_V_C$ samples by a factor of $-1$.

Figure 6:
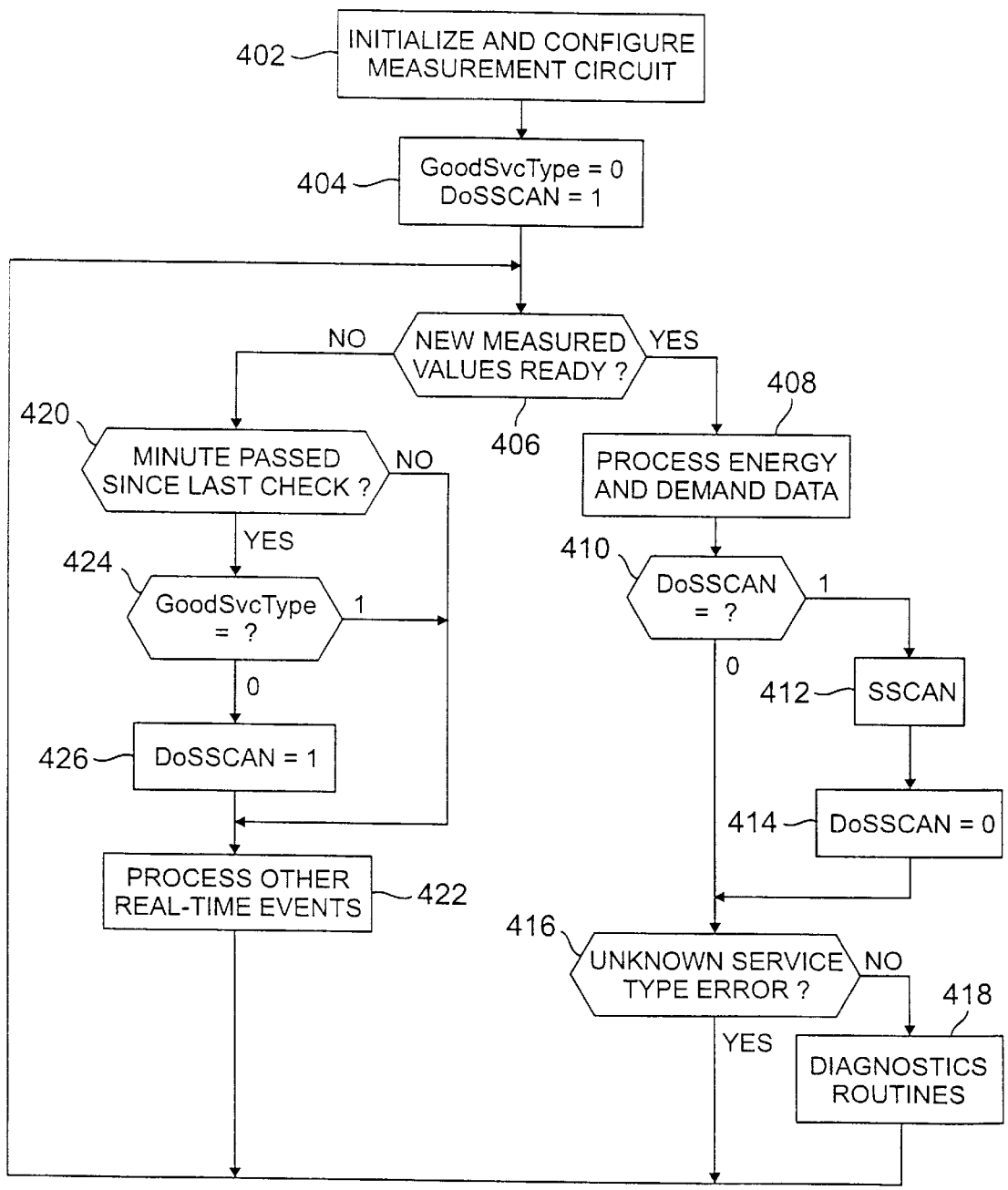
FIG. 6 shows a more detailed flow diagram of the operations performed by a controller in an exemplary embodiment of the present invention.

FIG. 6 shows in further detail the operations of a meter controller in an exemplary implementation of the present invention. In this exemplary implementation, the controller is utilized in a meter having a 9S meter form. In general, the operations described below are equally applicable to other meter forms, requiring only minor modifications.

FIG. 6 shows the main operational loop of a controller of a meter having a similar structure similar to that described in connection with FIG. 4 above. FIG. 6 illustrates, among other things, one way in which the steps described above in connection with FIG. 5 operate in the context of other metering operations.

Referring specifically to FIG. 6, after power up, the controller initializes the measurement circuit of the meter. The measurement circuit may suitably be one having similar capabilities as the measurement circuit 104 of FIG. 4 (step 402). The controller configures the measurement circuit to perform power calculations appropriate for a default wiring configuration. In this example, the controller may configure the measurement circuit of the 9S meter to perform measurements and power calculations for a four wire wye wiring configuration. In other embodiments, including those involving other meter forms, the controller may of course configure the measurement circuit to perform measurements and power calculations for a different wiring configuration.

Once the measurement circuit is initialized, the controller sets two flags: GoodSvcType=0, representing that a good service type has not yet been identified; and DoSSCAN=1, representing that SSCAN is to be performed (step 404). The controller then begins the main loop. In the first step of the main loop (step 406), the controller determines whether new measured voltage (and current) magnitude and phase angle data, or simply measured data, is ready. New measured data is typically provided by the conversion circuit every 300 milliseconds. The 300 millisecond time frame allows for sufficient voltage samples to be accumulated to perform characteristic RMS magnitude calculations. It will be appreciated that the exact time period is given by way of example only.

If new measured data is ready, then the controller next processes various energy and demand variables (step 408). Electronic meters today often offer capabilities for measuring many aspects of the metered energy demand. The various energy and demand variables required to provide these capabilities are typically updated when each set of new measured data become available.

After the energy and demand variables have been processed, the controller determines the status of the DoS-SCAN flag (step 410). If the flag is set (1), then the controller performs the SSCAN routine (step 412). The SSCAN routine of step 412 attempts to determine the service type using the measured voltage magnitude and phase data. To do so, the controller compares the measured voltage magnitude and phase data to expected values. A table of expected values is shown in FIG. 10. Each entry on the table of FIG. 10 identifies expected values for a particular service type. If the measured values are sufficiently similar to one of the sets of expected values, then the meter operates under the service type corresponding to that set of expected values, and the GoodSvcType flag is set (1).

If, however, the measured values are not sufficiently similar to any of the sets of the expected values, but a pre-existing service type has been stored in the meter, then the meter proceeds under the pre-existing service type but does not set the GoodSvcType flag. Finally, if the measured values are not sufficiently similar to any of the sets of expected values, and no pre-existing service type has been stored, then an unknown service type error is set. A full explanation of a suitable routine that may be used as the SSCAN routine of step 412 can be found in U.S. patent application Ser. No. 08/690,973.

When the SSCAN routine has been completed, the controller resets the SSCAN flag to 0 (step 414) and proceeds to step 416. Referring again to step 410, if the controller determines that the SSCAN flag is cleared (0), then the controller proceeds directly to step 416.

In step 416, the controller determines whether there is an unknown service type error. If there is not an unknown service type error, then the controller may use the known service type to perform diagnostic routines (step 418), and return to the beginning of the main loop (step 406). The diagnostic routines are discussed in further detail below in connection with FIGS. 7, 7*a*, 8 and 9. If there is an unknown service type error, then, the controller skips the diagnostics and returns directly from step 416 to step 406.

Referring again to step 406, if the controller determines that new measured data is not ready, then the controller instead executes one or more real time software threads or events. The real time events include operations performed by the controller at specified or regular time intervals.

One such real time event is an SSCAN recheck, which in the present embodiment occurs every minute. Specifically, if new measured data is not ready (step 406), then the controller first determines whether a minute has passed since the last SSCAN recheck (step 420). SSCAN is preferably rechecked every minute in order to provide a time cushion during meter power-up. For example, in heavy duty meter forms, such as 480 volt four wire delta forms, the meter is powered up one phase at a time, and may take several minutes to power-up. In such a meter, the controller may power up when the first phase is powered up, and may attempt to perform SSCAN several minutes before the other phases are operational. When the controller performs SSCAN before all the phases are powered up, the controller will not be able to recognize the service type.

If a minute has not passed since the last SSCAN recheck, then the controller skips the SSCAN recheck proceeds to execute other real time events (step 422). If, however, a minute has passed since the last SSCAN recheck, then the controller determines the status of the GoodSvcType flag (step 424). If the GoodSvcType flag is set (1), then the SSCAN routine need not be executed, and the controller proceeds to execute other real time events (step 422). If, however, the GoodSvcType flag is cleared (0), indicating that the service type has not yet been correctly identified, then the controller sets the DoSSCAN flag to 1 (step 426). With the DoSSCAN flag set, the controller will perform SSCAN after the next time the controller executes step 410. In any event, after step 426, the controller proceeds to execute the other real-time events, and, specifically, normal metering functions (step 422).

The other real-time events include other routines that the controller performs at regular time intervals. For example, the other real-time events include functions such as display processing, time of use schedule checking, demand interval processing, and communications. The implementation and details of such other real-time events are outside the scope of the invention, and may readily be incorporated by one of ordinary skill in the art.

FIGS. 7, 7a, 8 and 9 show detailed flow diagrams of the operations performed by a controller of an electrical utility meter to detect wiring errors and effect compensations for detected wiring errors. In general, the flow diagram in FIGS. 7, 7a, 8 and 9 illustrate the diagnosis and correction of several common meter wiring errors, including missing voltage, voltage polarity reversal, current polarity reversal, and cross-phasing. The flow diagram of FIGS. 7, 7a, 8, and 9 represent in further detail the diagnostic routine of step 418 of FIG. 6.

Missing Voltage Error

Figure 7:
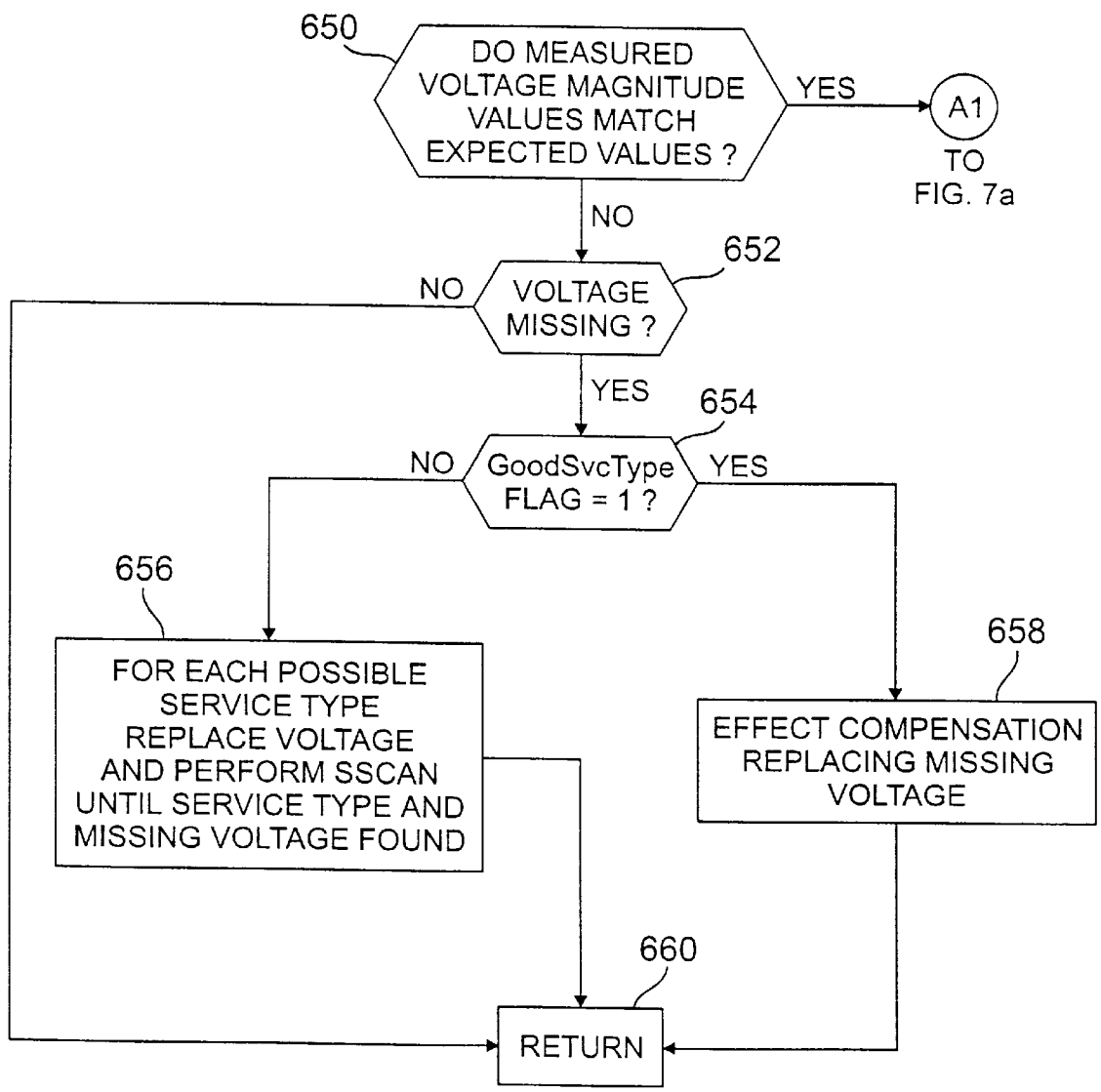
FIGS. 7, 7a, 8 and 9 show detailed flow diagrams of the operations performed by a controller to detect a plurality wiring errors and effect compensations for the detected wiring errors.

The diagnostics routine begins with step 650 of FIG. 7. FIG. 7 shows a flow diagram of the portion of the diagnostics routine that detects and effects a compensation for a wiring error that causes a missing voltage measurement. An example of such a wiring error may be illustrated by reference to FIG. 1. Referring to FIG. 1, a missing voltage measurement can occur when one of the phase A, B, or C voltage sensors, 26, 28 and 30, respectively, is not connected to its corresponding power line.

Referring again to FIG. 7, in step 650, the controller determines whether the measured voltage magnitude values corresponded to their expected values. The measured voltage magnitude values for a 9S meter form consist of $VRMS_A$, $VRMS_B$, and $VRMS_C$. In other meter forms, such as 5S meter forms, phase B is not measured and therefore $VRMS_B$ need not be included. The expected values are values for a plurality of service types are stored within memory, such as the memory 110 of FIG. 4. For example, FIG. 10 shows a table of expected values for a plurality of service types in which a 9S meter form is employed.

The measured values are considered to match, or are compliant with, the expected values if each measured value is within a predefined tolerance level of its corresponding expected value. Those of ordinary skill in the art may select suitable tolerance levels. If the measured voltage magnitude values each match (within tolerance) their corresponding expected values, or, in other words, are compliant, then the controller proceeds to perform further diagnostics to determine if any wiring errors are present (step 702 of FIG. 7a).

If, however, the measured values are not compliant, then the controller first determines whether any of phase voltage measurements are missing while its respective phase current is still present (step 652). To this end, the controller first determines whether there are any phases that have a non-zero measured current value, $IRMS_X \neq 0$, but no measured voltage value, $VRMS_X \neq 0$. If no voltage measurements are missing while current is present, then the controller returns to continue with normal metering functions (step 660). In such a case, the controller may suitably set an error flag and cause such an error to be displayed.

If, however, the controller determines that a voltage measurement is missing, then the controller next determines whether the GoodSvcType flag is set (step 654). As discussed above in connection with step 412 of FIG. 6, the controller is operable to determine the service type upon power up using the SSCAN routine. If the service type was identified in step 402, then the GoodSvcType flag is set. In some instances, however, a meter may be moved from one location to another, and then installed into a different service type. In such a case, the SSCAN routine (step 412 of FIG. 6) may not recognize the service type when the meter was powered up. Although the service type may not be recognized, the controller would retain the previously-determined service type, and would not set the GoodSvcType flag. The GoodSvcType flag is checked in step 654 in order to handle situations in which a meter is moved to a different service type and there is a missing voltage wiring error.

Accordingly, if the GoodSvcType flag is equal to 0, then the controller determines the service type and replaces the missing voltage measurement (step 656). In particular, the controller determines the service type and replaces the missing voltage measurement using the following method. The controller first picks a first candidate service type from the service type table. As discussed above, the service type table may be stored in a memory and contain data similar to that illustrated in FIG. 10. The controller then replaces the value of the missing voltage, $VRMS_X$ with the appropriate value from the table for the first candidate service type. Thereafter, the controller performs the SSCAN routine to determine whether the addition of the $VRMS_X$ value enables the service type to be recognized. If so, then the recognized service type becomes the new service type, and the controller replaces the identified missing voltage. The missing voltage is replaced in the manner described below in connection with step 658. The controller may thereafter return to its normal operations (step 660). If the addition of the $VRMS_X$ value does not enable recognition of the service type, then the controller selects a second candidate service type and repeats the above steps of: replacing the missing voltage $VRMS_X$ with the appropriate value from the second candidate service type; and performing the SSCAN routine. The process may be repeated until all possible values of $VRMS_X$ that are appropriate for the various service types have been substituted and SSCAN performed.

For example, consider a situation in which $VRMS_A=277$, $VRMS_B=277$, $VRMS_C=0$, and GoodSvcType=0. In step 656, the controller would select a first candidate service type from the service type table, such as the 4 WY-120 V service type from FIG. 10. The controller would then replace the missing voltage value $VRMS_C$ with 120 V, and then perform SSCAN. The SSCAN routine in such a case would not successfully recognize the service type because $VRMS_A=227$, $VRMS_B=227$, and $VRMS_C=120$. Accordingly, the controller would select a second candidate service type, such as the 4 WY-277 V service type. The controller would replace VRMS$_C$ with 277 and perform SSCAN again. The SSCAN routine would then successfully recognize the 4 WY-277 V service type because VRMS$_C$ is set equal to 277. As a result, in such an example, the controller would effect a compensation to replace the phase C voltage measurement with a 277 volt AC waveform.

The above process beginning with step 656 represents an important aspect of the present invention. That process allows an unrecognized service type that is also missing a phase voltage to be both recognized and subsequently corrected.

Referring again to step 654, if GoodSvcType=1, then the controller proceeds to step 658. In step 658, the controller performs an adjustment that operates to replace a missing voltage. To this end, the controller controls the operation of the conversion circuit, such as the conversion circuit 106, to effectuate the adjustment to replace the missing voltage. Specifically, to perform the appropriate power metering calculations, the meter requires that the actual voltage waveform be replaced. To replace the waveform, the controller causes the conversion circuit to generate a substitute digital measurement signal for the missing phase voltage using adjusted and/or combined versions of at least one of the other phase voltage digital measurement signals.

To accomplish such replacement, it is noted that each phase voltage digital measurement signal may be expressed as a phase-shifted version of another phase voltage digital measurement signal or a combination of the other two phase voltage digital measurement signals. For example, any voltage phase signal of a four wire wye wiring configuration may be replaced by the inverted sum of the remaining two phase voltage signals. Thus, $V_A$ may be expressed as:

$$V_A = -(V_B + V_C)$$

In such a case, the controller would cause the DSP to substitute the negative of the sum of the samples from phase B and phase C into any term of the power equation that normally require the samples from phase A. For example, the calculation of power in watts would be calculated by the DSP using the following equation:

$$\begin{aligned}POWER = {} & -(CAL\_V_B DIG\_V_B + CAL\_V_C DIG\_V_C)* \\ & (CAL\_I_A DIG\_I_A) + (CAL\_V_B DIG\_V_B)* \\ & (CAL\_I_B DIG\_I_B) + (CAL\_V_C DIG\_V_C)* \\ & (CAL\_I_A DIG\_I_A - (CAL\_V_B DIG\_V_B + \\ & CAL\_V_C DIG\_V_B)*(CAL\_I_A DIG\_I_A) + \\ & (CAL\_V_B DIG\_V_B)*(CAL\_I_B DIG\_I_B) + \ldots\end{aligned} \quad (3)$$

The above calculation may be performed by the conversion circuit 106 illustrated in FIG. 4 in the manner described below. Referring to FIG. 4, it is noted that to implement the above power calculation, the samples DIG\_$V_B$ and DIG\_$V_C$ must be provided to the DSP 128 simultaneously. To do so, the third multiplexer 120 and third A/D 126 are employed to convert and provide a second simultaneous voltage sample to the DSP 128. Specifically, to carry out the above exemplary equation wherein the phase A voltage is missing, the second multiplexer 118 would not select voltage measurement signals from each of the three voltage sensors 26, 28, and 30 in a phase rotation: A, B, C, A, B, C, A, . . . , as is done in the normal operation. Instead, the second multiplexer 118 selects the voltage measurement signals in the following phase rotation: B, B, C, B, B, C, B . . . In cooperative fashion, the third multiplexer 120 selects the voltage measurement signals in the following rotation: C, X, X, C, X, X, C . . . (where X is a "Don't Care" value). In this manner, the voltage signals from B and C may be simultaneously converted by the second A/D 124 and third A/D 126 and provided to the DSP 128 in the time slot normally allotted to the voltage measurement signals from phase A.

While the above example illustrates the adjustments to the conversion circuit 106 that are necessary for replacing a missing phase A voltage measurement signal, those of ordinary skill in the art may readily apply the above techniques to the replacement of the phase B and phase C voltage measurement signals.

Referring again to FIG. 7, the controller in step 658 may use related techniques to replace voltages in a four wire delta wiring configuration. For example, a missing phase A voltage signal may be replaced by simply substituting an inverted phase B voltage signal. The controller simply performs the appropriate adjustment to replace the missing voltage based on the service type.

Once the controller has performed the appropriate adjustment to replace the missing voltage, the controller may return to normal operations (step 660).

It is noted that other methods may be used to replace a missing voltage signal. For example, the conversion circuit or measurement circuit of the meter may include a memory in which is stored a look-up table consisting of a sequence the digital voltage measurement samples corresponding to a 120, 277, 240, or 480 volt sine wave. In such a case, the conversion circuit may use the samples from memory, inserted in the appropriate phase relationship, to replace a missing voltage phase.

Voltage Polarity Error

Figure 7A:
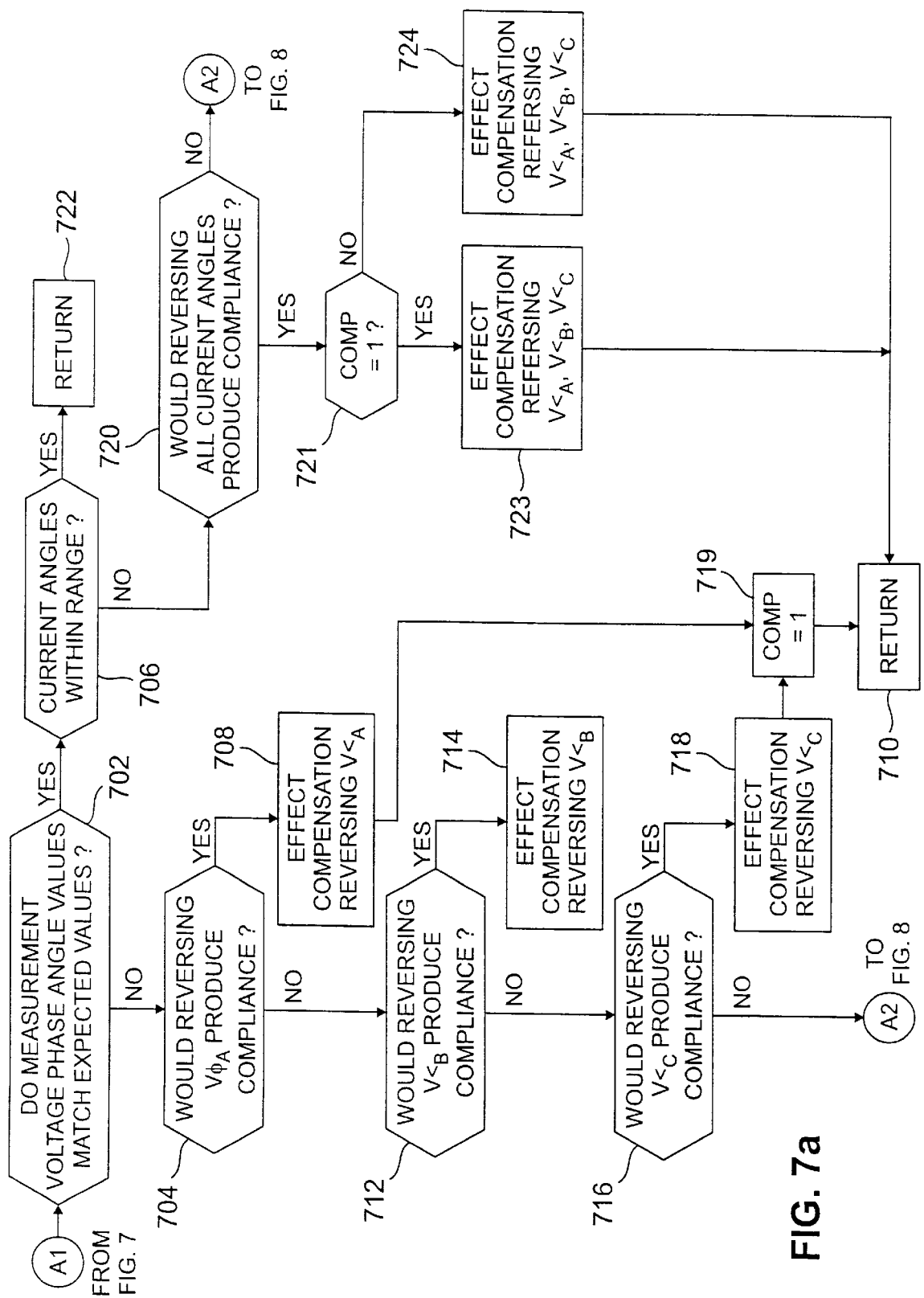

FIG. 7a shows the flow of operations that are executed by the processor if in step 650 of FIG. 7, the controller determines that all of the measured voltage magnitude values are compliant. FIG. 7a shows a flow diagram of the diagnostic routine that identifies and effects a compensation for a voltage polarity reversal. A voltage polarity reversal exists, for example, when a voltage sensor of a meter is miswired. FIGS. 2 and 2a illustrated an example of a miswired phase C voltage sensor 30 that results in a voltage polarity error.

In operation, the controller first determines whether the measured voltage phase angle values correspond to their expected values (step 702). For example, the measured voltage phase angle values for a 9S meter form consist of V$<_A$, V$<_B$, and V$<_C$. Similar to the expected magnitude values, the expected phase angle values are stored within memory, such as the memory 10 of FIG. 4. For example, FIG. 10 shows a table of expected phase angle values for a plurality of service types in which a 9S meter form is employed.

Similar to the measured voltage magnitude values, the measured voltage phase angle values are considered to match the expected values if each measured value is within a predefined tolerance level of its corresponding expected value. Those of ordinary skill in the art may select suitable tolerance levels. If the measured phase angle values are compliant, then the controller proceeds to perform further diagnostics to determine if any other types of wiring errors are present (step 706).

If, however, the measured voltage phase angle values are not compliant, then a wiring error is indicated and the controller proceeds with diagnosing and compensating for the wiring error. In general, the controller identifies if a phase voltage polarity error exists, or in other words, if any of V<$_A$, V<$_B$ or V<$_C$ is approximately 180° out of phase. To this end, the controller executes the flow diagram steps beginning with step 704.

In step 704, the controller determines whether reversing the phase of the phase A voltage measurement would produce compliant measured voltage phase angle values. To this end, the processor adds (or subtracts) 180° from the measured V<$_B$ and V<$_C$ values and recompares those values with the expected values. Because V<$_A$ is generally used as the reference phase angle, which is always 0°, reversing V<$_B$ and V<$_C$ provides a sufficient approximation of the effects of reversing V<$_A$. If the comparison of the reversed V<$_B$ and V<$_C$ indicates the measured voltage phase angles are now compliant, then a voltage polarity error is indicated, and the controller proceeds to effect a compensation for the voltage polarity error (step 708). If not, however, then the controller continues its diagnosis (step 712).

In step 708, the controller effects the compensation by altering the configuration of the meter's measurement circuit or conversion circuit such that the phase A voltage measurements are reversed in phase. This may be accomplished a number of ways, including, for example, multiplying phase A digital voltage measurement signal samples by −1. In the exemplary embodiment described in FIG. 4, the controller 108 may suitably provide a control signal to the DSP 128 that causes the DSP 128 to insert a −1 multiplier in equation (1) for phase A only. The −1 multiplier may be inserted into the phase A calculation by multiplying the phase A calibration constant, CAL$_A$, by −1.

It is noted that reversing a phase voltage polarity using the method described above in connection with steps 704 and 708 will compensate for two distinct types of wiring errors. The first type of wiring error that is compensated by reversing a phase voltage polarity is an error in which the phase voltage sensor corresponding to the compensated phase voltage is reverse wired. For example, compensating the phase A voltage measurement will compensate a wiring error in which the phase A voltage sensor is reverse wired. The second wiring error that would be compensated in steps 704 and 708 is a situation in which all of the phase voltage sensor devices except than the one corresponding to the compensated phase voltage are wired backwards. In other words, if the phase B and phase C voltage sensors are wired backwards, step 704 and step 708 will effectively reverse the polarity of the phase A voltage measurement. In such a case, however, it is noted that while the compensated measured angles, V<$_A$, V<$_B$, and V<$_C$ appear to have the right angular relationship, they are all actually 180° out of phase. Such a situation could cause errors in subsequent power consumption calculations. Steps 720, 721, 723, and 724, discussed below, address that situation to avoid such errors.

To assist in the detection of the effective reversal of all of the voltage phases in steps 720, 721, 723, and 724, the controller sets a compensation, or COMP flag=1, to indicate that at least one phase voltage measurement signal has been reversed, which indicates the possibility that all three phase voltages are 180° out of phase. The controller then returns to its normal operations (step 710). In other words, the controller proceeds from step 618 as shown in FIG. 6 and discussed above.

Referring again to step 704, if it is determined that the reversal of the phase of V$_A$ would not produce compliant measured voltage values, then the controller determines if reversing the phase of V$_B$ would produce compliant values (step 712). Accordingly, in step 712, the controller adds (or subtracts) 180° from the measured V<$_B$ value and recompares that value with its corresponding expected value. If the recomparison evidences that each of the measured values, including the adjusted V<$_B$ are compliant, then a voltage polarity error is indicated for V$_B$, and the controller proceeds to effect a compensation for the voltage polarity error (step 714). If not, however, then the controller continues its diagnosis (step 716).

In step 714, the controller effects the compensation by altering the configuration of the meter's measurement circuit such that the phase B voltage measurements are reversed in phase. This may be accomplished by causing the phase B digital voltage measurement signal samples to be multiplied by a factor −1, analogous to the technique described above for the compensation of a V$_A$ phase reversal in step 708. Once the controller effects the compensation, the controller then sets the COMP flag equal to 1 (step 719), and returns to its normal operations (step 710). In other words, the controller proceeds from step 418 as shown in FIG. 6 and discussed above.

If, in step 712, it is determined that the reversal of the phase of V$_B$ would not produce compliant measured voltage values, then the controller determines if reversing the phase of V$_C$ would produce compliant values (step 716). Accordingly, the controller adds (or subtracts) 180° from the measured V<$_C$ value and recompares that value with its corresponding expected value. If the recomparison evidences that each of the measured values, including the adjusted V<$_C$ is compliant, then a voltage polarity error is indicated for V$_C$, and the controller proceeds to effect a compensation for the voltage polarity error (step 718).

In step 718, the controller effects the compensation by altering the configuration of the meter's measurement circuit such that the phase B voltage measurements are reversed in phase. This may be accomplished in a manner suitably analogous to that described above for the compensation of the V$_A$ and V$_B$ phase reversals in steps 708 and 714, respectively. Once the controller effects the compensation, the controller then sets the COMP flag equal to 1 (step 719), and returns to its normal operations (step 710). In other words, the controller proceeds from step 418 as shown in FIG. 6 and discussed above.

It is noted that some meter forms do not include a phase B measurement for either voltage or current. It will be appreciated that the above flow diagram may suitably be used in such a situation. The only effect the absence of phase B would have would be to ensure that the answer in step 712 is in the negative. As a result, the flow diagram will operate as if step 714 did not exist.

Figure 8:
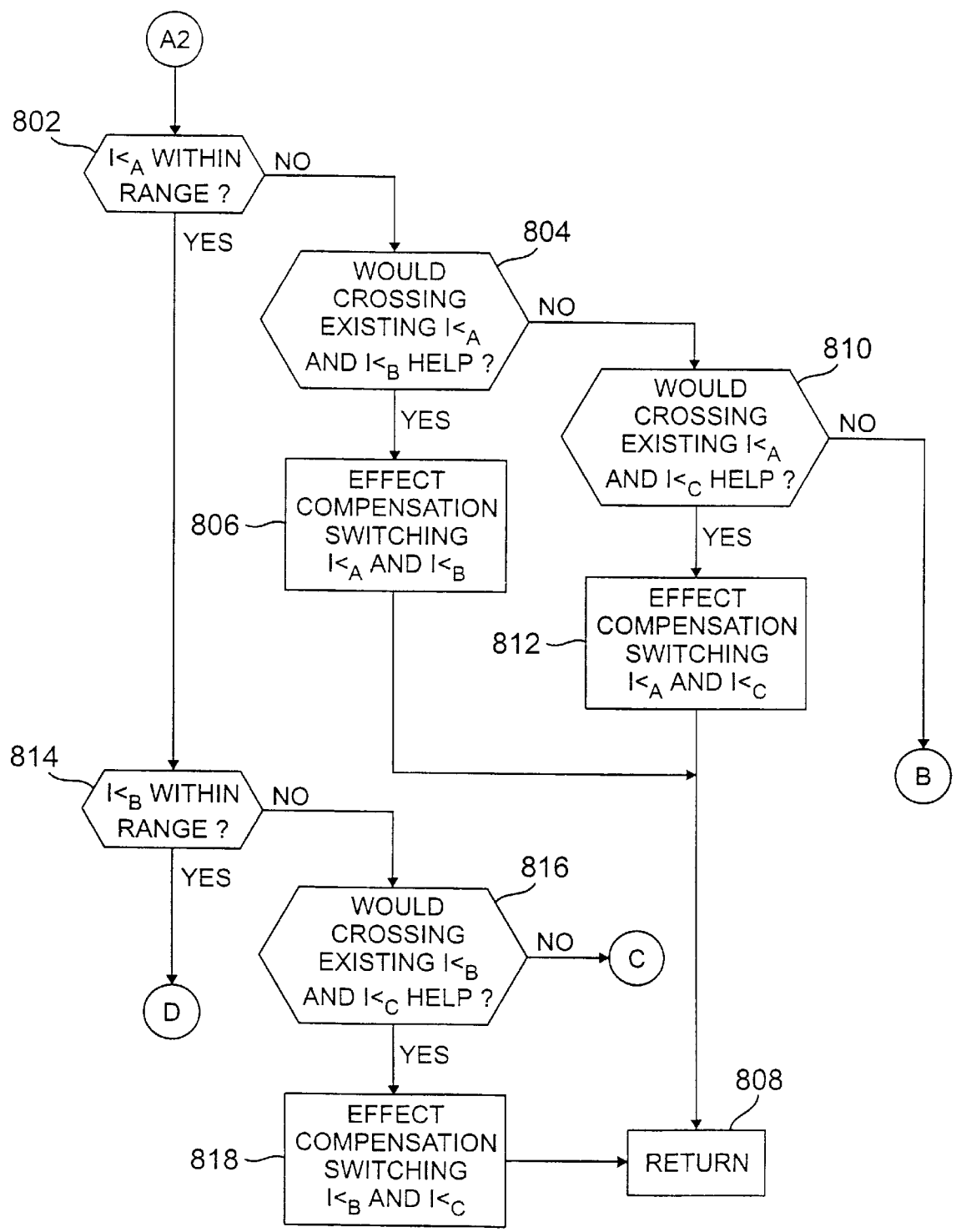

If, however, in step 716, it is determined that the reversal of the phase of V$_C$ would not produce compliant measured voltage phase angle values, then the controller continues with diagnostics and proceeds to execute step 802 of FIG. 8.

Referring again to FIG. 7a, and, in particular, step 702, if the controller determines that each of the measured voltage phase angle values is compliant, then the controller performs further diagnostics beginning with step 706. In step 706, the controller determines whether the current phase angles, I<$_A$, I<$_B$, and I<$_C$, are within acceptable range of the corresponding voltage phase angles, I<$_A$, I<$_B$, and I<$_C$, respectively. According to the present embodiment, a current I<$_x$ is within an acceptable window of V<$_x$ if I<$_x$ is within ±90° of V<$_x$. The use of ±90° as the acceptable window allows for a wide range of loads on the metered electrical system. For example, some loads are almost completely inductive in nature, thereby causing a nearly 90° variance between the corresponding current and voltage phase angles. If the acceptable window is relatively narrow, such loads could cause the diagnostics routine to erroneously detect a wiring error.

If all of the current phase angles fall within the acceptable range, or, in other words, are compliant, then no wiring error is indicated and the controller completes the diagnostics routine and returns to its normal metering operations as shown in FIG. 6.

If, however, at least one current phase angle is not compliant, then the controller continues with the diagnostics. In particular, the controller determines whether a current polarity error exists on all of the phases (step 720). A polarity error on all current phases can arise from several causes. For example, the current sensors in the meter may all be reverse wired. More likely, however, a polarity reversal in all phases may be caused by a prior compensation for a voltage polarity reversal in steps 706, 712, or 716, as discussed above in connection with step 719. Specifically, if two of three voltage sensors are miswired, the controller, operating in accordance with steps 706, 708, 712, 714, 716, and 718, will effectively reverse the phase of the digital voltage measurement signal in the other phase, thereby causing the digital voltage measurement signals of all three phases to be 180° out of phase. In such a case, the current phase angles and the voltage phase angles would all be (approximately) 180 out of phase from each other.

Returning to the general description of FIG. 7, in step 720, the controller determines whether adding (or subtracting) 180° from all of $I<_A$, $I<_B$, and $I<_C$ would produce compliant measured current values. If not, the controller continues with diagnostics beginning with step 802 of FIG. 8. However, if reversing all of the current phase angles would produce compliance, then the controller determines whether the compensation flag COMP is set equal to 1 (step 721). If the answer in step 721 is yes, then the controller effects a compensation reversing all of the voltage phase angles. Specifically, if the controller determines that all of the measure voltage phase angle values are 180° out of phase with their corresponding current phase angle values (step 720), and that a voltage phase angle has been compensated (step 721), then the controller identifies that the voltage phase angle values, as compensated, are all 180° out of phase. The controller thus effects the compensation to reverse all of the measured voltage phase angles. If, however, in step 721, it is determined that the flag (COMP is not set equal to 1, then the controller effects a compensation reversing all of the current phase angles. Once the controller has effected the compensation, the controller the returns to normal metering operations (step 710).

Cross Phasing Error

FIG. 8 shows a continuation of the diagnostics routine flow diagram initiated in FIG. 7, discussed above. In general, the portion of the flow diagram shown in FIG. 8 detects and compensates for wiring errors defined as cross phasing errors, such as exemplified in FIGS. 3 and 3a. There are three possibilities for cross phasing errors: one in which $I<_A$ and $I<_B$ are interchanged, one in which $I<_A$ and $I<_C$ are interchanged, and one in which $I<_B$ and $I<_C$ are interchanged. It is also noted, that because $V<_A$ is always the reference angle, voltage cross phasing errors can only vary in whether the order of the phases is ABC or CBA. Such variances are tolerated and may suitably be considered to be part of the service type definition. Accordingly, if there is a voltage cross phasing situation, it is not considered to be a wiring error. Instead, the controller just determines that the service type includes a CBA phase ordering, as shown in FIG. 10. In any event, the controller executes the operations illustrated in FIG. 8 to detect and compensate for the three possible current cross phasing errors.

The controller first determines whether $I<_A$ is within its acceptable window, or in other words, within ±90° of $V<_A$ (step 802). If so, then no cross phasing error that includes $I_A$ is indicated and the controller proceeds to step 814, discussed further below. If not, however, then a cross phasing error may be indicated and the controller next determines if switching the $I<_A$ and $I<_B$ will produce appropriate values (step 804). To this end, the controller determines whether $I<_A$, as measured, is within ±90° of $V<_B$, and $I<_B$, as measured, is within ±90° of $V<_A$. If so, then the controller effects a compensation that corrects the cross phasing of $I<_A$ and $I<_B$ (step 806).

In the exemplary embodiment of FIG. 4, the controller may effect the compensation by providing control signals to the first multiplexer 116 and the second multiplexer 118. The control signals cause the second multiplexer 118 to provide the DIG\_$I_B$ samples to the DSP 128 (through the A/D converter 124) contemporaneous to the delivery of the DIG\_$V_A$ samples (through the A/D converter 122) to the DSP 128 by the first multiplexer 116. The control signals also cause the second multiplexer 118 to provide the DIG\_$I_A$ samples to the DSP 128 contemporaneous to the delivery of the DIG\_$V_B$ samples to the DSP 128 by the first multiplexer 116. As described above, the DSP 128 performs the power measurement described in equation (1) by multiplying the current and voltage samples that arrive contemporaneously. As a result of the compensation, the DSP 128 would multiply DIG\_$V_A$ by DIG\_$I_B$ as they are received, and DIG\_$V_B$ by DIG\_$I_A$ as they are received. In other words, the DSP 128 effectively carries out the following revised power measurement:

$$\text{POWER} = V_A I_B + V_B I_A + V_C I_C \tag{4}$$

The controller preferably provides another control signal that switches any calibration constants associated with $I_A$ and $I_B$ such that the constants are applied to the proper DIG\_V*DIG\_I multiplication. The above described compensation substantially reduces, and effectively eliminates, any error introduced to the power consumption measurement of the meter caused by a cross phase wiring error.

Returning again to the discussion flow diagram of FIG. 8, if in step 804 it is determined that exchanging $I<_A$ and $I<_B$ would not produce a set of compliant phase angle values, then the controller next determines if switching the $I<_A$ and $I<_C$ will produce appropriate values (step 810). To this end, the controller determines whether $I<_A$, as measured, is within ±90° of $V<_C$, and $I<_C$, as measured, is within ±90° of $V<_A$. If both conditions are satisfied, then the controller effects a compensation that corrects the cross phasing of $I<_A$ and $I<_C$ (step 812).

To effect the compensation in the exemplary embodiment of an electrical utility meter shown in FIG. 4, the controller 108 provides control signals that causes the first multiplexer 116 to provide the DIG\_$I_C$ samples to the DSP 128 (through the A/D converter 122) contemporaneous to the provision of DIG\_$V_A$ samples to the DSP 128, and vice versa. Accordingly, the DSP 128 effectively performs the calculation:

$$\text{POWER} = V_A I_C + V_B I_B + V_C I_A \tag{5}$$

Once the controller effects the compensation, the controller returns to ordinary metering operations (step 808).

If, however, in step 810 it is determined that reversing $I<_A$ and $I<_C$ does not produce compliant current phase angle values, then a cross phasing error involving $I_A$ is not indicated. Accordingly, the controller performs further diagnostics to determine the cause of the non-compliant measured value for $I<_A$ beginning with step 902 of FIG. 9, discussed further below.

Referring again to step 802, if I<$_A$ is within ±90° of V<$_A$, then the controller determines whether I<$_B$ is within ±90° of V<$_B$ (step 814). If so, then no cross phasing errors are indicated because neither I<$_A$ nor I<$_B$ appear to be cross phased. Accordingly, if the answer to the question in step 814 is in the affirmative, the controller proceeds to step 912 of FIG. 9, discussed further below.

If, however, it is determined that I<$_B$ is not within ±90° of V<$_B$, then the controller determines whether exchanging I<$_B$ and I<$_C$ will produce compliant current phase angles values (step 816). To make this determination, as before, the controller determines whether I<$_B$ as measured, is within ±90° of V<$_C$, and I<$_C$, as measured, is within ±90° of V<$_B$. If both conditions are satisfied, then a cross phasing error is indicated for I<$_B$ and I<$_C$ and the controller effects a compensation that corrects the cross phasing error (step 818).

To effect the compensation in the exemplary embodiment of an electrical utility meter shown in FIG. 4, the controller 108 provides a control signal that causes the first multiplexer 116 to provide the DIG__I$_C$ samples to the DSP 128 contemporaneous to the provision of DIG__V$_B$ samples to the DSP 128, and vice versa. Accordingly, the DSP 128 effectively performs the calculation:

$$\text{POWER } V_A I_A + V_B I_C + V_C I_B \qquad (6)$$

Once the controller effects the compensation, the controller returns to ordinary metering operations (step 808).

If, however, in step 816, the controller determines that reversing the phase angle values I<$_B$ and I<$_C$ would not produce a set of compliant angle values, then no cross phase wiring error is indicated. The controller then proceeds to step 908 of FIG. 9.

Figure 9:
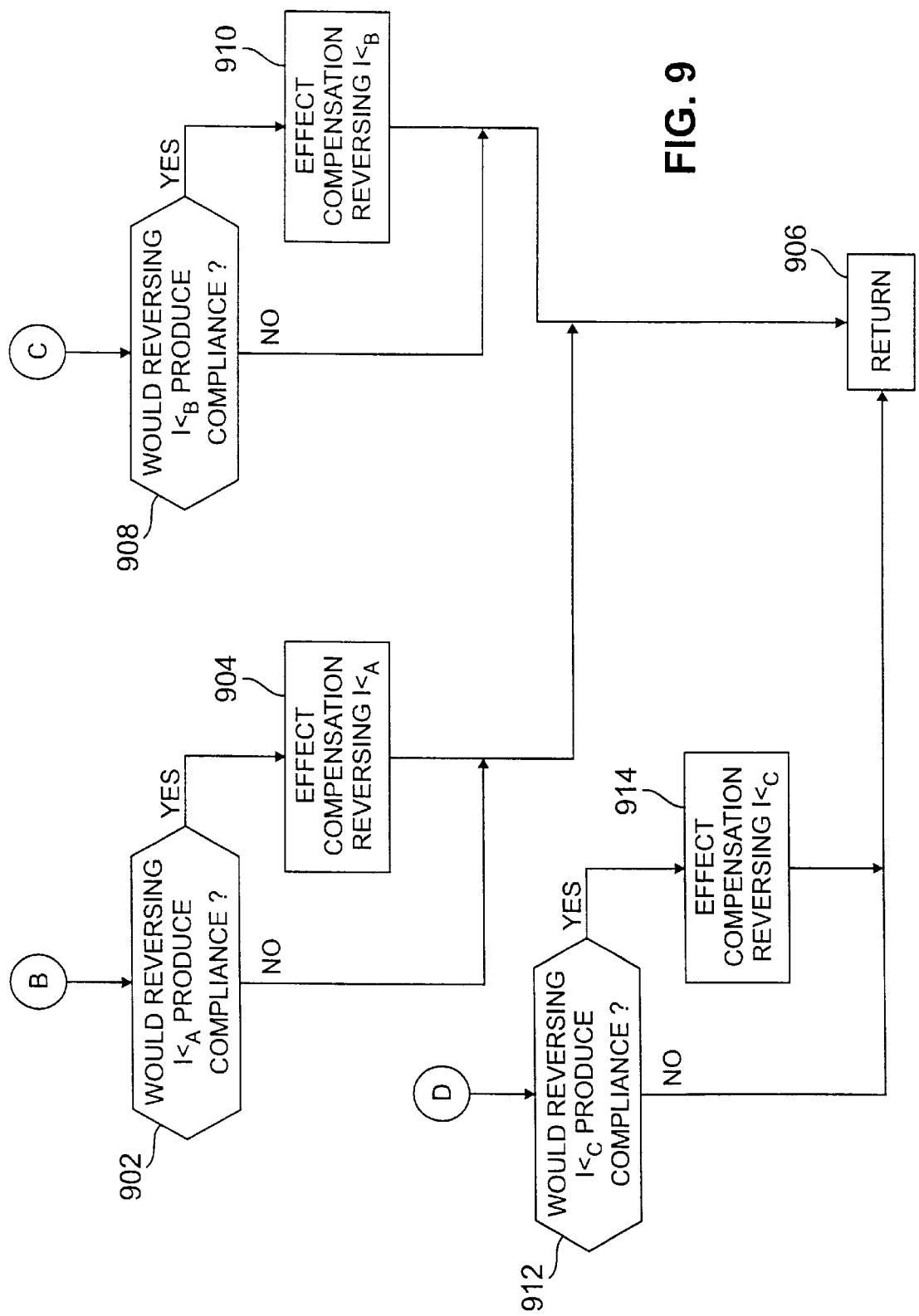

Current Polarity Error FIG. 9 shows a continuation of the diagnostics routine flow diagram initiated in FIG. 7 and continued in FIGS. 7a and 8, discussed above. In general, the portion of the flow diagram shown in FIG. 9 detects and compensates for wiring errors defined as current polarity errors. A current polarity error is an error in which one or more phase currents are 180° out of phase. Current polarity errors, like voltage polarity errors, are often caused by the miswiring of current sensing devices to the power lines of the electrical system being measured. Although current polarity errors are generally identified and compensated for during execution of the flow diagram of FIG. 9, it is noted that steps 720, 721 and 724 of FIG. 7a address the detection of and compensation for the occurrence of a current polarity error on all three phases.

Referring to FIG. 9, the controller executes step 902 after executing step 810 of FIG. 8. At step 810, the controller has already determined that I<$_A$ in not within an acceptable range with respect to V<$_A$. Accordingly, in step 902 of FIG. 9, the controller determines whether there is current polarity error on phase A. To this end, the controller determines whether I<$_A$+180° is within ±90° of V<$_A$. It is noted that, in the present embodiment, wherein the acceptable range is within ±90° of V<$_A$, the answer in step 902 should always be yes, and the determination of step 902 may be excluded. More specifically, step 902 is not reached unless I<$_A$ is not within ±90° of V<$_A$, and therefore I<$_A$+180° will always be within ±90° of V<$_A$. However, in other embodiments, such a wide range of acceptable values may not be used and the determination of step 902 would be necessary.

If the determination in step 902 is in the affirmative, then a polarity error is indicated for phase A and the controller effects a suitable compensation therefor (step 904). The compensation, for example, may comprise providing a signal that causes the phase A current samples to be phase reversed. Specifically, in the exemplary embodiment of FIG. 4, the controller 108 may provide a control signal to the DSP 128 that causes the DSP 128 to multiply all DIG__I$_A$ samples by a factor of −1. Once the compensation is effected, the controller returns to normal metering operations (step 906), as illustrated in FIG. 6.

If the determination in step 902 is in the negative, then the controller may perform additional diagnostics, not shown, to determine the source of the non-compliant measured I<$_A$ value, or simply return to normal metering operations (step 906).

The controller executes step 908 after executing step 816 of FIG. 8. At step 816, the controller has already determined that I<$_A$ is compliant and that I<$_B$ is not compliant. Accordingly, in step 908 of FIG. 9, the controller determines whether there is current polarity error on phase B. To this end, the controller determines whether I<$_B$+180° is within ±90° of V<$_B$. In the present embodiment, wherein the acceptable range is within ±90° of V<$_B$, then the answer in step 908 should always be yes, and the determination of step 908 may be excluded. However, as discussed above, the determination of step 908 would be necessary if the range of compliant measured current phase angle values is less than ±90°.

If the determination in step 908 is in the affirmative, then a current polarity error is indicated for phase B and the controller effects a suitable compensation therefor (step 910). The compensation, for example, may comprise providing a signal that causes the phase B current samples to be phase reversed. In the exemplary embodiment of FIG. 4, the controller 108 may provide a control signal to the DSP 128 that causes the DSP 128 to multiply all DIG__I$_B$ samples by −1. Once the compensation is effected, the controller returns to normal metering operations (step 906), as illustrated in FIG. 6.

If the determination in step 908 is in the negative, then the controller may execute further diagnostics, not shown, to determine the source of the non-compliant I<$_B$ value, or simply return to normal metering operations (step 906).

The controller executes step 912 after executing step 814 of FIG. 8. At step 814, the controller has already determined that I<$_A$ and I<$_B$ have acceptable values and that I<$_C$ does not have an acceptable value (see also steps 706 and 802). Accordingly, in step 912 of FIG. 9, the controller determines whether there is I<$_C$ has a polarity error. To this end, the controller determines whether I<$_C$+180° is within ±90° of V<$_C$. As was the case in steps 902 and 908, the answer in step 902 should always be yes for the present embodiment. However, as discussed above, the determination of step 912 may be necessary in other embodiments in which the range of acceptable current phase angle values is less than ±90°.

If the determination in step 912 is in the affirmative, then a current polarity error is indicated for phase C and the controller effects a suitable compensation therefor (step 914). The compensation is analogous to those described above in connection with steps 904 and 910. Once the compensation is effected, the controller returns to normal metering operations (step 906), as illustrated in FIG. 6.

If the determination in step 912 is in the negative, then a wiring error was not successfully diagnosed and the controller returns to normal metering operations (step 906).

It is noted that the above described embodiments are merely illustrative. Those of ordinary skill in the art may readily devise their own implementations that incorporate the principles of the present invention and fall within the spirit and scope thereof. For example, the operations of the DSP 128 of FIG. 4 may be performed by two or more discrete digital components. Those of ordinary skill in the art may readily replace the DSP with suitable alternative digital processing circuitry.

We claim:

1. In an electrical utility meter, the electrical utility meter operable to measure power consumption, a method of detecting and compensating for a wiring error that affects the power consumption measurement of the electrical utility meter, the method comprising:
   a) obtaining measured phase angle data for a plurality of phases in a polyphase electrical system;
   b) periodically performing one or more diagnostic tests using the measured phase angle data to determine whether a wiring error is present; and
   c) automatically adjusting the operation of the electrical utility meter to effect a compensation for the wiring error, said compensation increasing an accuracy of power consumption measurement of the electrical utility meter.

2. The method of claim 1 wherein step a) further comprises obtaining measured voltage phase angle data, wherein step b) further comprises periodically performing one or more diagnostic tests using the measured voltage phase angle data to determine whether a voltage polarity error is present, said voltage polarity error comprising at least one phase voltage being approximately 180° out of phase, and wherein step c) further comprises automatically adjusting the operation of the utility meter by effecting a compensation for the voltage polarity error.

3. The method of claim 1 wherein step a) further comprises obtaining measured current phase angle data and measured voltage phase angle data, wherein step b) further comprises periodically performing one or more diagnostic tests using the measured voltage phase angle data and measured current phase angle data to determine whether a cross phase error is present, and wherein step c) further comprises automatically adjusting the operation of the electrical utility meter to effect a compensation for the cross phase error.

4. The method of claim 1 wherein step a) further comprises obtaining measured current phase angle data, wherein step b) further comprises periodically performing one or more diagnostic tests using the measured current phase angle data to determine whether a current polarity error is present, and wherein step c) further comprises automatically adjusting the operation of the electrical utility meter to effect a compensation for the current polarity error.

5. The method of claim 1 wherein step a) further comprises obtaining measured voltage magnitude and phase angle data and measured current magnitude and phase angle data, step b) further comprises periodically performing one or more diagnostic tests using the measured voltage magnitude and phase angle data and the measured current phase angle data to determine whether one of a plurality of wiring errors is present and further identifying the wiring error from the plurality of wiring errors if a wiring error is present, and wherein step c) further comprises automatically adjusting the operation of the electrical utility meter to effect a compensation for the identified wiring error.

6. The method of claim 1 wherein step a) further includes obtaining measured voltage magnitude data, step b) further comprises periodically performing one or more diagnostic tests using the measured voltage magnitude data to determine whether a missing voltage error is present, and wherein the controller is further operable to adjust the operation of the electrical utility meter to effect a compensation for the missing voltage error.

7. The method of claim 1 wherein the controller is further operable to periodically perform one or more diagnostic tests by obtaining expected values from a memory and comparing the measured phase angle data to the expected values.

8. The method of claim 1 further comprising a step d) of determining a present service type corresponding to the polyphase electrical system from a plurality of possible service types.

9. The method of claim 7 wherein step a) further comprises obtaining measured voltage magnitude data, and wherein the method further comprises:
   d) obtaining the expected values for one or more of the plurality of possible service types from the memory; and
   e) comparing the expected values for one or more of the plurality of possible service types to the measured voltage magnitude data and the measured phase angle data.

10. The method of claim 1 wherein step a) further comprises:
    receiving voltage and current measurement signals for a plurality of phases in a polyphase electrical system;
    employing an analog to digital converter to generate digital measurement signals using said voltage and current measurement signal, said digital measurement signals including digital voltage measurement signals and digital current measurement signals for each phase of the polyphase electrical system, and
    generating measured data using the digital measurement signals, said measured data comprising measured voltage magnitude and phase angle data and measured current magnitude and phase angle data.

11. The method of claim 10 wherein the digital measurement signals each comprise a sampled waveform including one or more samples, and wherein step a) further comprises generating watts data by multiplying digital voltage measurement signal samples by digital current measurement signal samples for each phase of the polyphase electrical system.

12. The method of claim 1 wherein step a) further comprises generating measured voltage magnitude data by performing a root-mean-square calculation on a plurality of digital voltage measurement signal samples for each phase.

13. The method of claim 11 wherein step a) further comprises generating measured current magnitude data by performing a root-mean-square calculation on a plurality of digital current measurement signal samples for each phase.

14. The method of claim 11 wherein step a) further comprises generating measured voltage phase angle data using the zero crossings of the digital voltage measurement signals for the plurality of phases in the polyphase electrical system.

15. The method of claim 11 wherein step b) further comprises periodically performing one or more diagnostic tests using the measured data to determine whether a voltage polarity error is present, said voltage polarity error comprising at least one phase voltage being approximately 180° out of phase, and wherein controller is further operable to adjust the operation of the utility meter by effecting a compensation for the voltage polarity error.

16. The method of claim 15 wherein step c) further comprises effecting the compensation for the voltage polarity error by causing the digital signal processor to multiply the digital voltage measurement signal samples corresponding to at least one phase of the polyphase electrical system by −1.

17. The method of claim 11 wherein step b) further comprises performing one or more diagnostic tests using the measured data to determine whether a cross phase error is present, said cross phase error comprising a digital current measurement signal for a first phase to correspond to a second phase of the polyphase electrical system, and a digital current measurement signal for the second phase to correspond to a first phase of the polyphase electrical system, and wherein the controller is further operable to adjust the operation of the electrical utility meter to effect a compensation for the cross phase error.

18. The method of claim 17 wherein step c) further comprises effecting the compensation for the cross phase error by causing the digital signal processor to generate watts data by multiplying the digital current measurement signal samples of the first phase by the digital voltage measurement signal samples of the second phase and by multiplying the digital voltage measurement signal samples of the first phase by the digital current measurement signal samples of the second phase.

19. The method of claim 11 wherein step b) further comprises performing one or more diagnostic tests using the measured data to determine whether a current polarity error is present, and wherein the controller is further operable to adjust the operation of the electrical utility meter to effect a compensation for the current polarity error.

20. The method of claim 19 wherein step c) further comprises effecting the compensation for the current polarity error by causing the digital signal processor to multiply the current voltage measurement signal samples corresponding to at least one phase of the polyphase electrical system by −1.

21. In an electrical utility meter, the electrical utility meter operable to measure power consumption, a method of detecting and identifying a wiring error that affects the power consumption measurement of the electrical utility meter, the method comprising:
   a) obtaining measured data for a plurality of phases in a polyphase electrical system, said measured data comprising measured voltage magnitude and phase angle data and measured current magnitude and phase angle data;
   b) automatically identifying the present electrical service type based on the measured voltage magnitude and phase angle data; and
   c) periodically performing one or more diagnostic tests using at least a portion of the measured data and the present electrical service type to determine whether a wiring error is present and to identify the wiring error from a plurality of wiring errors if a wiring error is detected.

22. The method of claim 21 further comprising a step:
   d) automatically adjusting the operation of the electrical utility meter to effect a compensation for the identified wiring error, said compensation increasing an accuracy of power consumption measurement of the electrical utility meter.

23. The method of claim 21 further comprising a step:
   d) displaying information on a meter display that provides an indication corresponding to the identified wiring error.

24. An arrangement for use in an electrical utility meter, the electrical utility meter operable to be connected to one or more electrical service types, the arrangement operable to detect and compensate for a wiring error, the arrangement comprising:
   a) a conversion circuit for generating a power consumption measurement and for generating measured phase angle data for a plurality of phases in a polyphase electrical system;
   b) a memory; and
   c) a controller operably connected to said memory and said conversion circuit, the processor operable to
      receive measured phase angle data for a plurality of phases in a polyphase electrical system,
      periodically perform one or more diagnostic tests using the measured phase angle data to determine whether a wiring error is present, and
      automatically adjust the operation of the conversion circuit to effect a compensation for the wiring error, said compensation increasing an accuracy of power consumption measurement of the electrical utility meter.

25. The arrangement of claim 24 wherein said polyphase electrical system includes a plurality of phase voltages and a plurality of phase currents, and wherein the conversion circuit is operable to generate measured phase angle data using zero crossings of each of the plurality of phase voltages.

26. The arrangement of claim 24 wherein said polyphase electrical system includes a plurality of phase voltages and a plurality of phase currents, and wherein the conversion circuit is operable to generate watts data and VAR data, and wherein the measurement circuit is operable to generate measured phase angle data using the watts data and VAR data.

27. The arrangement of claim 24 wherein the controller is further operable to periodically performing one or more diagnostic tests using the measured phase angle data to determine whether a voltage polarity error is present, said voltage polarity error comprising at least one phase voltage being approximately 180° out of phase, and wherein controller is further operable to adjust the operation of the utility meter by effecting a compensation for the voltage polarity error.

28. The arrangement of claim 24 wherein the controller is further operable to perform one or more diagnostic tests using the measured phase angle data to determine whether a cross phase error is present, and wherein the controller is further operable to adjust the operation of the electrical utility meter to effect a compensation for the cross phase error.

29. The arrangement of claim 24 wherein the controller is further operable to perform one or more diagnostic tests using the measured phase angle data to determine whether a current polarity error is present, and wherein the controller is further operable to adjust the operation of the electrical utility meter to effect a compensation for the current polarity error.

30. The arrangement of claim 24 wherein the conversion circuit is further operable to generate measured phase voltage magnitude data and measured phase current magnitude data for a plurality of phases in a polyphase electrical system.

31. The arrangement of claim 30 wherein the conversion circuit is further operable to obtain measured voltage magnitude and phase angle data and measured current magnitude and phase angle data, and wherein the controller is further operable to
   receive the measured voltage magnitude and phase angle data and measured current magnitude and phase angle data,
   periodically perform one or more diagnostic tests using the measured voltage magnitude and phase angle data and the measured current magnitude and phase angle data to determine whether one of a plurality of wiring errors is present, identify the wiring error from the plurality of wiring errors if a wiring error is present, and adjust the operation of the electrical utility meter to effect a compensation for the identified wiring error.

32. An arrangement for use in an electrical utility meter, the electrical utility meter operable to be connected to one or more electrical service types, the arrangement operable to detect and compensate for a wiring error, the arrangement comprising:

a) a conversion circuit for generating a power consumption measurement and for generating measured data, said measured data including measured voltage magnitude and phase angle data and measured current magnitude and phase angle data for a plurality of phases in a polyphase electrical system;

b) a memory; and c) a controller operably connected to said memory and said conversion circuit, the processor operable to receive said measured data for a plurality of phases in a polyphase electrical system, periodically perform one or more diagnostic tests using the measured data to determine whether a wiring error is present, and automatically adjust the operation of the conversion circuit to effect a compensation for the wiring error, said compensation increasing an accuracy of power consumption measurement of the electrical utility meter.

33. The arrangement of claim 32 wherein the controller is further operable to periodically performing one or more diagnostic tests using the measured data to determine whether a voltage polarity error is present, said voltage polarity error comprising at least one phase voltage being approximately 180° out of phase, and wherein controller is further operable to adjust the operation of the utility meter by effecting a compensation for the voltage polarity error.

34. The arrangement of claim 32 wherein the controller is further operable to perform one or more diagnostic tests using the measured data to determine whether a cross phase error is present, and wherein the controller is further operable to adjust the operation of the electrical utility meter to effect a compensation for the cross phase error.

35. The arrangement of claim 32 wherein the controller is further operable to perform one or more diagnostic tests using the measured data to determine whether a current polarity error is present, and wherein the controller is further operable to adjust the operation of the electrical utility meter to effect a compensation for the current polarity error.

36. The arrangement of claim 32 wherein the controller is further operable to perform one or more diagnostic tests using the measured data to determine whether a missing voltage error is present, and wherein the controller is further operable to adjust the operation of the electrical utility meter to effect a compensation for the missing voltage error.

37. The arrangement of claim 32 wherein the controller is further operable to periodically perform one or more diagnostic tests by obtaining expected values from the memory and comparing the measured data to the expected values.

38. The arrangement of claim 32 wherein the controller is further operable to determine a service type corresponding to the polyphase electrical system from a plurality of possible service types.

39. The arrangement of claim 38 wherein the memory contains expected values corresponding to the plurality of possible service types and the controller is further operable to determine the service type corresponding to the polyphase electrical system by obtaining the expected values for one or more of the plurality of possible service types from the memory and comparing the expected values for one or more of the plurality of possible service types to the measured data.

40. The arrangement of claim 32 wherein the conversion circuit includes at least one analog to digital ("A/D") converter operable to receive voltage and current measurement signals for a plurality of phases in a polyphase electrical system and generate digital measurement signals, said digital measurement signals including digital voltage measurement signals and digital current measurement signals for each phase of the polyphase electrical system, and wherein the conversion circuit further includes means for receiving the digital measurement signals and generating the measured data therefrom.

41. The arrangement of claim 40 wherein the digital measurement signals each comprise a sampled waveform including one or more samples, and wherein the conversion circuit generates watts data by multiplying digital voltage measurement signal samples by digital current measurement signal samples for each phase.

42. The arrangement of claim 41 wherein the means for receiving digital measurement signals and generating measured data is operable to generate measured voltage magnitude data by performing a root-mean-square calculation on a plurality of digital voltage measurement signal samples for each phase.

43. The arrangement of claim 42 wherein the means for receiving digital measurement signals and generating measured data is operable to generate measured current magnitude data by performing a root-mean-square calculation on a plurality of digital current measurement signal samples for each phase.

44. The arrangement of claim 41 wherein the means for receiving digital measurement signals and generating measured data is operable to generate measured voltage phase angle data using the zero crossings of the digital voltage measurement signals for the plurality of phases in the polyphase electrical system.

45. The arrangement of claim 41 wherein the controller is further operable to periodically performing one or more diagnostic tests using the measured data to determine whether a voltage polarity error is present, said voltage polarity error comprising at least one phase voltage being approximately 180° out of phase, and wherein controller is further operable to adjust the operation of the utility meter by effecting a compensation for the voltage polarity error.

46. The arrangement of claim 45 wherein the controller is operable to effect the compensation for the voltage polarity error by causing the means for receiving digital measurement signals and generating measured data to multiply the digital voltage measurement signal samples corresponding to at least one phase of the polyphase electrical system by −1.

47. The arrangement of claim 41 wherein the controller is further operable to perform one or more diagnostic tests using the measured data to determine whether a cross phase error is present, said cross phase error comprising a digital current measurement signal for a first phase to correspond to a second phase of the polyphase electrical system, and a digital current measurement signal for the second phase to correspond to a first phase of the polyphase electrical system, and wherein the controller is further operable to adjust the operation of the electrical utility meter to effect a compensation for the cross phase error.

48. The arrangement of claim 47 wherein the controller is further operable to effect the compensation for the cross phase error by causing the means for receiving digital measurement signals and generating measured data to generate watts data by multiplying the digital current measurement signal samples of the first phase by the digital voltage measurement signal samples of the second phase and by multiplying the digital voltage measurement signal samples of the first phase by the digital current measurement signal samples of the second phase.

49. The arrangement of claim 41 wherein the controller is further operable to perform one or more diagnostic tests using the measured data to determine whether a current polarity error is present, and wherein the controller is further operable to adjust the operation of the electrical utility meter to effect a compensation for the current polarity error.

50. The arrangement of claim 49 wherein the controller is operable to effect the compensation for the current polarity error by causing the means for receiving digital measurement signals and generating measured data to multiply the current voltage measurement signal samples corresponding to at least one phase of the polyphase electrical system by −1.

51. The arrangement of claim 41 wherein the controller is further operable to perform one or more diagnostic tests using the measured data to determine whether a missing voltage error is present, and wherein the controller is further operable to adjust the operation of the electrical utility meter to effect a compensation for the missing voltage error.

52. An arrangement for use in an electrical utility meter, the electrical utility meter operable to be connected to one or more electrical service types, the arrangement comprising:

a) a conversion circuit for generating a power consumption measurement and for generating measured data, said measured data including voltage magnitude and phase angle data and current magnitude and phase angle data for a plurality of phases in a polyphase electrical system;

b) a memory; and c) a controller operably connected to said memory and said conversion circuit, the processor operable to receive measured data for a plurality of phases in a polyphase electrical system, identify a present electrical service type based on the measured voltage magnitude and phase angle data; and perform one or more diagnostic tests using at least a portion of the measured data and the present electrical service type to determine whether a wiring error is present and to identify the wiring error from a plurality of wiring errors if a wiring error is detected.

53. The arrangement of claim 52 wherein the controller is further operable to:

automatically adjust the operation of the electrical utility meter to effect a compensation for the identified wiring error, said compensation increasing an accuracy of power consumption measurement of the electrical utility meter.

54. The arrangement of claim 52 further comprising a display connected to the controller for displaying information that provides an indication corresponding to the identified wiring error.

55. The arrangement of claim 52 wherein the controller is further operable to periodically performing one or more diagnostic tests using the measured data to determine whether a voltage polarity error is present, said voltage polarity error comprising at least one phase voltage being approximately 180° out of phase, and wherein controller is further operable to adjust the operation of the utility meter by effecting a compensation for the voltage polarity error.

56. The arrangement of claim 52 wherein the controller is further operable to perform one or more diagnostic tests using the measured data to determine whether a cross phase error is present, and wherein the controller is further operable to adjust the operation of the electrical utility meter to effect a compensation for the cross phase error.

57. The arrangement of claim 52 wherein the controller is further operable to perform one or more diagnostic tests using the measured data to determine whether a current polarity error is present, and wherein the controller is further operable to adjust the operation of the electrical utility meter to effect a compensation for the current polarity error.

58. The arrangement of claim 52 wherein the controller is further operable to perform one or more diagnostic tests using the measured data to determine whether a missing voltage error is present, and wherein the controller is further operable to adjust the operation of the electrical utility meter to effect a compensation for the missing voltage error.

59. The arrangement of claim 52 wherein the controller is further operable to periodically perform one or more diagnostic tests by obtaining expected values from the memory and comparing the measured data to the expected values.

* * * * *